(12) United States Patent
Jung

(10) Patent No.: US 11,715,683 B2
(45) Date of Patent: Aug. 1, 2023

(54) STRIP SUBSTRATE HAVING PROTECTION PATTERN BETWEEN SAW LINE PATTERNS

(71) Applicant: Samsung Electronics Co., Ltd., Suwon-si (KR)

(72) Inventor: Sunnyeong Jung, Asan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 44 days.

(21) Appl. No.: 17/395,060

(22) Filed: Aug. 5, 2021

(65) Prior Publication Data

US 2022/0199510 A1    Jun. 23, 2022

(30) Foreign Application Priority Data

Dec. 22, 2020 (KR) .................... 10-2020-0181152

(51) Int. Cl.
*H01L 23/498* (2006.01)
*H01L 21/48* (2006.01)
*H01L 23/544* (2006.01)

(52) U.S. Cl.
CPC ...... *H01L 23/49838* (2013.01); *H01L 21/486* (2013.01); *H01L 21/4857* (2013.01); *H01L 23/49816* (2013.01); *H01L 23/49822* (2013.01); *H01L 23/544* (2013.01)

(58) Field of Classification Search
CPC ......... H01L 23/49838; H01L 23/49816; H01L 23/49822
See application file for complete search history.

(56) References Cited

U.S. PATENT DOCUMENTS

| | | | |
|---|---|---|---|
| 6,653,731 B2 | 11/2003 | Kato et al. |
| 6,852,607 B2 | 2/2005 | Song et al. |
| 6,976,415 B2 | 12/2005 | Suzuki et al. |
| 7,919,833 B2 | 4/2011 | Park |
| 8,883,614 B1 | 11/2014 | Lei et al. |
| 9,451,700 B2 | 9/2016 | Otsubo |
| 2004/0113244 A1 | 6/2004 | Shin et al. |

(Continued)

FOREIGN PATENT DOCUMENTS

| | | |
|---|---|---|
| JP | 2005-191090 A | 7/2005 |
| JP | 6281871 B2 | 2/2018 |

(Continued)

*Primary Examiner* — Michael Jung
(74) *Attorney, Agent, or Firm* — Harness, Dickey & Pierce, P.L.C.

(57) ABSTRACT

Disclosed is a strip substrate including a dielectric layer that has a plurality of unit regions spaced apart from each other in a first direction and a saw line region between the unit regions, a plurality of conductive dummy patterns on corresponding unit regions of the dielectric layer, a plurality of saw line patterns on the saw line region of the dielectric layer and extending in a second direction that intersects the first direction, and a protection pattern that covers the dielectric layer. Ends of the conductive dummy patterns are spaced apart from each other in a direction parallel to the first direction. Ends of the saw line patterns are spaced apart from each other in a direction parallel to the second direction. The protection pattern is between the ends of the conductive dummy patterns and between the ends of the saw line patterns.

14 Claims, 18 Drawing Sheets

(56) References Cited

U.S. PATENT DOCUMENTS

| | | | | |
|---|---|---|---|---|
| 2009/0243045 | A1* | 10/2009 | Pagaila | H01L 24/12 |
| | | | | 257/E21.268 |
| 2012/0034760 | A1* | 2/2012 | Schuderer | H01L 21/78 |
| | | | | 257/E21.599 |
| 2012/0074534 | A1* | 3/2012 | Lin | H01L 23/562 |
| | | | | 438/464 |
| 2017/0025361 | A1* | 1/2017 | Lee | H01L 23/00 |
| 2019/0088603 | A1* | 3/2019 | Marimuthu | H01L 23/552 |
| 2021/0375797 | A1* | 12/2021 | Cotronakis | H01L 24/49 |

FOREIGN PATENT DOCUMENTS

| | | |
|---|---|---|
| KR | 2002-0091327 A | 12/2002 |
| KR | 100499003 B1 | 7/2005 |
| KR | 100887479 B1 | 3/2009 |
| KR | 2011-0058107 A | 6/2011 |

* cited by examiner

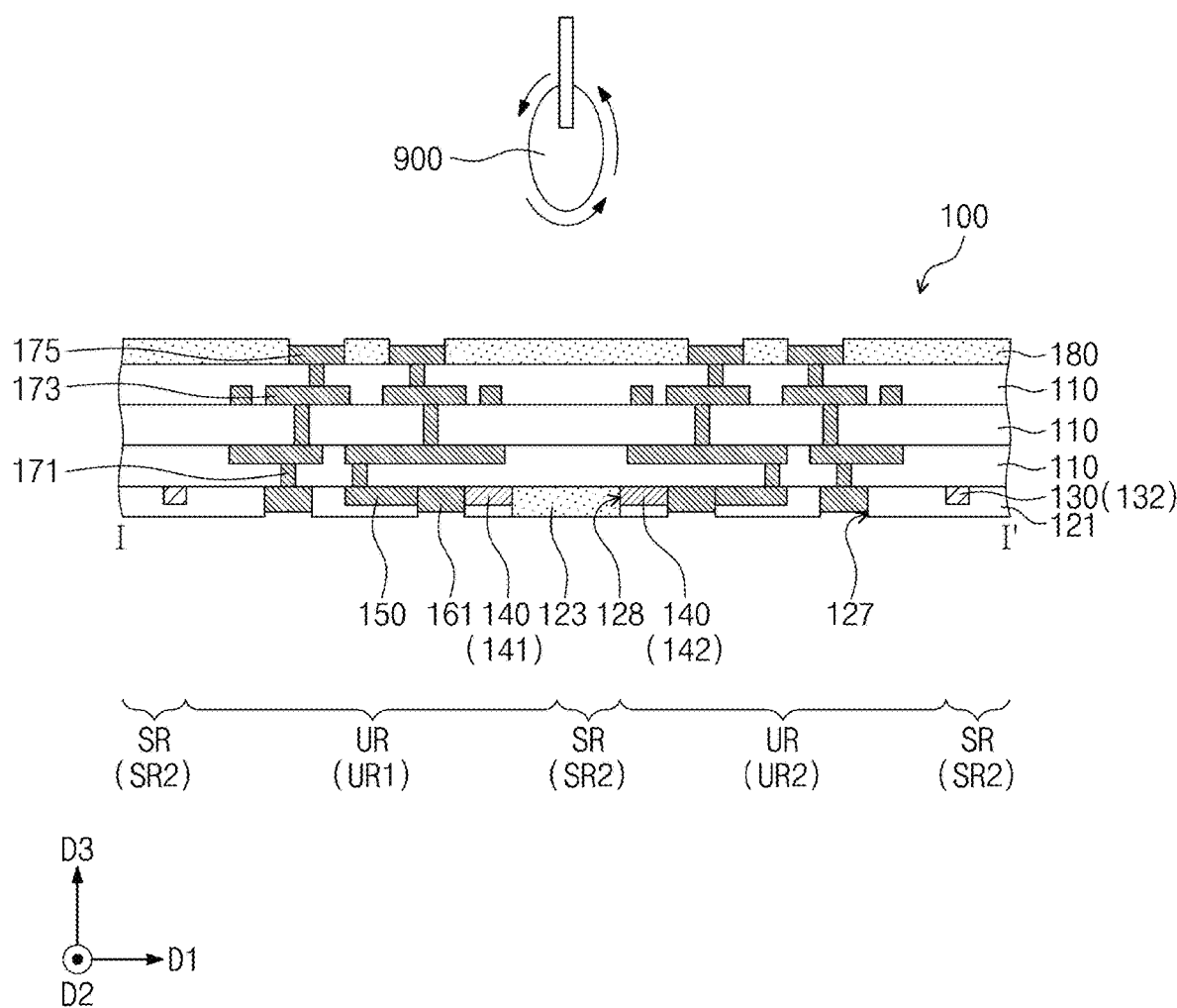

STRIP SUBSTRATE HAVING PROTECTION PATTERN BETWEEN SAW LINE PATTERNS

CROSS-REFERENCE TO RELATED APPLICATION

This U.S. nonprovisional application claims priority under 35 U.S.C § 119 to Korean Patent Application No. 10-2020-0181152, filed on Dec. 22, 2020 in the Korean Intellectual Property Office, the disclosure of which is hereby incorporated by reference in its entirety.

BACKGROUND

Inventive concepts relate to a semiconductor package, and more particularly, to a semiconductor package fabricated by using a strip substrate.

A semiconductor package is provided to implement an integrated circuit chip to qualify for use in electronic products. A semiconductor package may be fabricated by mounting a semiconductor chip on a package substrate, and then using bonding wires or bumps to electrically connect the semiconductor chip to the package substrate. For example, a printed circuit board (PCB) may be used as the package substrate. Damage to the package substrate may reduce the reliability of the semiconductor package.

SUMMARY

Some example embodiments of inventive concepts provide a strip package having enhanced reliability and/or a method of fabricating the same.

Some example embodiments of inventive concepts provide a semiconductor package with increased reliability.

According to some example embodiments of inventive concepts, a strip substrate may include a dielectric layer that includes a plurality of unit regions and a saw line region between the plurality of unit regions, the plurality of unit regions being spaced apart from each other in a first direction when viewed in plan; a plurality of conductive dummy patterns on corresponding ones of the plurality of unit regions of the dielectric layer, respectively; a plurality of saw line patterns on the saw line region of the dielectric layer, the plurality of saw line patterns extending in a second direction that intersects the first direction; and a protection pattern that covers the dielectric layer. Ends of the plurality of conductive dummy patterns may be spaced apart from each other in a direction parallel to the first direction. Ends of the plurality of saw line patterns may be spaced apart from each other in a direction parallel to the second direction. The protection pattern may be between the ends of the plurality of conductive dummy patterns and between the ends of the plurality of saw line patterns.

According to some example embodiments of inventive concepts, a semiconductor package may include a package substrate having a top surface and a bottom surface; a semiconductor chip on the top surface of the package substrate; and a solder terminal on the bottom surface of the package substrate. The package substrate may include a dielectric layer; a conductive dummy pattern on a bottom surface of the dielectric layer; a solder pad between the solder terminal and the bottom surface of the dielectric layer; and a protection pattern on the bottom surface of the dielectric layer. The protection pattern may cover a sidewall of the conductive dummy pattern. An outer wall of the protection pattern may be aligned with a sidewall of the dielectric layer. The conductive dummy pattern may be between the solder pad and the outer wall of the protection pattern. A thickness of the solder pad may be greater than a thickness of the conductive dummy pattern.

According to some example embodiments of inventive concepts, a strip substrate may include a dielectric layer that includes a first unit region, a second unit region spaced apart in a first direction from the first unit region, and a saw line region between the first region and the second unit region, when viewed in plan; a first conductive dummy pattern on a bottom surface of the first unit region of the dielectric layer; a second conductive dummy pattern on a bottom surface of the second unit region of the dielectric layer; a first solder pad on the bottom surface of the first unit region of the dielectric layer and electrically connected to the first conductive dummy pattern; a second solder pad on the bottom surface of the second unit region of the dielectric layer and electrically connected to the second conductive dummy pattern; a first wiring pattern on the bottom surface of the first unit region of the dielectric layer and electrically connected to the first solder pad; a second wiring pattern on the bottom surface of the second unit region of the dielectric layer and electrically connected to the second solder pad; a plurality of saw line patterns on a bottom surface of the saw line region of the dielectric layer, each of the plurality of saw line patterns having a major axis parallel to a second direction that intersects the first direction; and a protection pattern on a bottom surface of the dielectric layer. A first end of the first conductive dummy pattern may be spaced apart in the first direction from a second end of the second conductive dummy pattern. Ends of the plurality of saw line patterns may be spaced apart from each other in a direction parallel to the second direction. Each of the plurality of saw line patterns may not be provided between the first end of the first conductive dummy pattern and the second end of the second conductive dummy pattern. The protection pattern may cover a sidewall of the first end of the first conductive dummy pattern, a sidewall of the second end of the second conductive dummy pattern, and sidewalls of the ends of the plurality of saw line patterns.

BRIEF DESCRIPTION OF THE DRAWINGS

FIGS. 7B and 8B illustrate cross-sectional views taken along line I-I' of FIGS. 7A and 8A, respectively.

DETAILED DESCRIPTION OF EMBODIMENTS

Figure 1A:
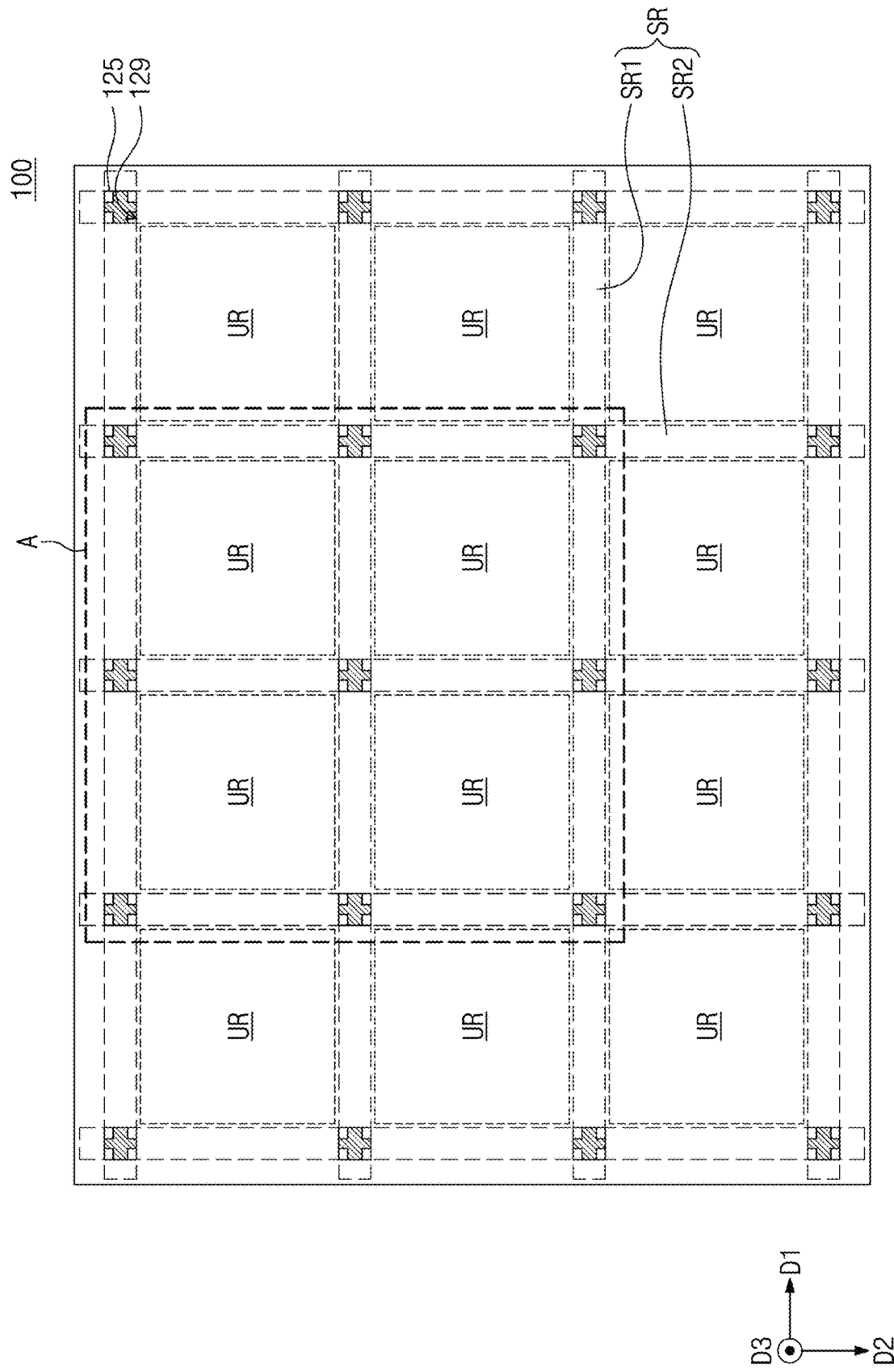
FIG. 1A illustrates a plan view showing a strip substrate according to some example embodiments.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

In this description, like reference numerals may indicate like components. The following will describe a strip substrate, a method of fabricating a strip substrate, a semiconductor package, and a method of fabricating a semiconductor package according to inventive concepts.

Figure 1B:
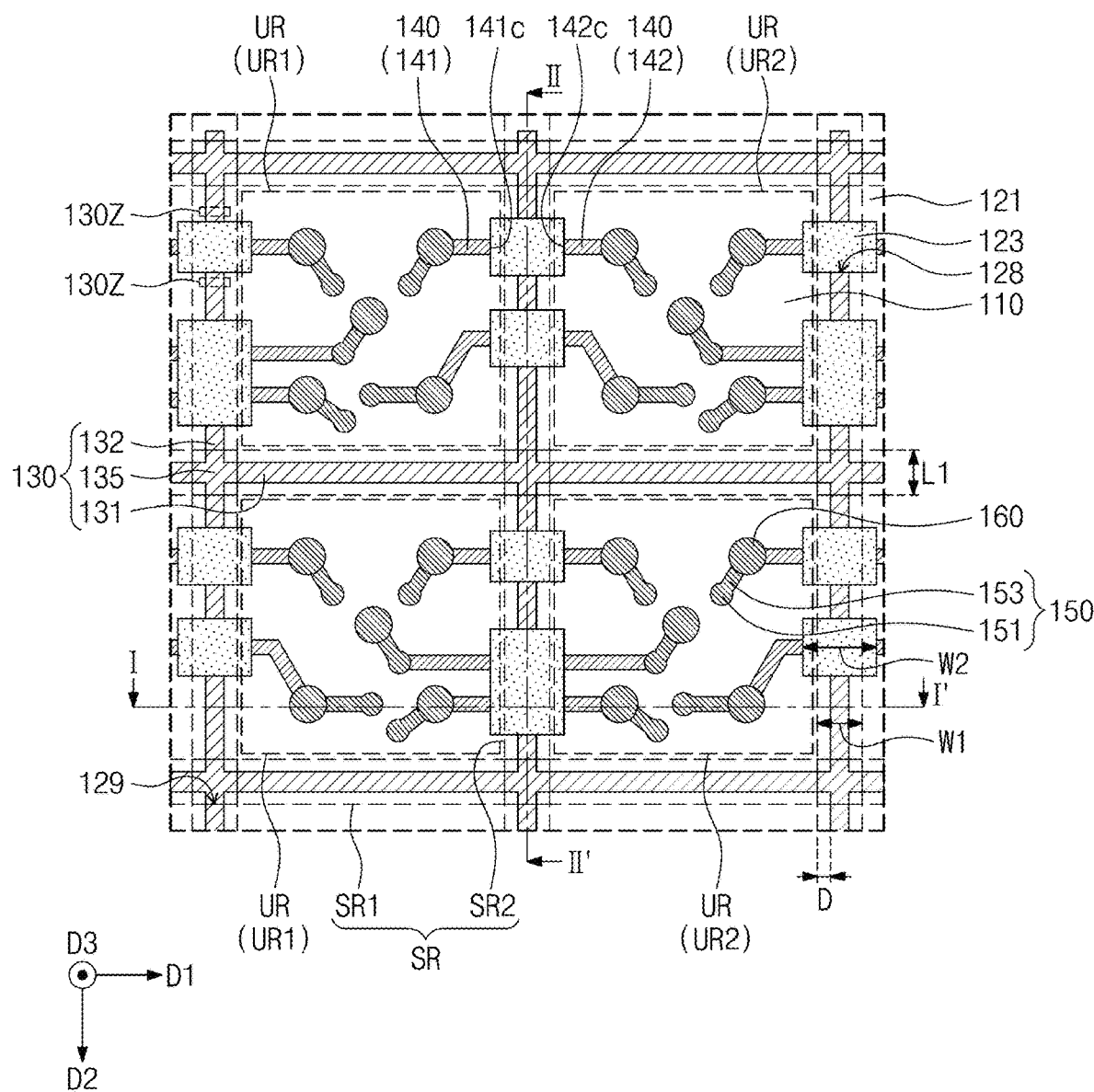
FIG. 1B illustrates an enlarged view showing section A of FIG. 1A.
Figure 1C:
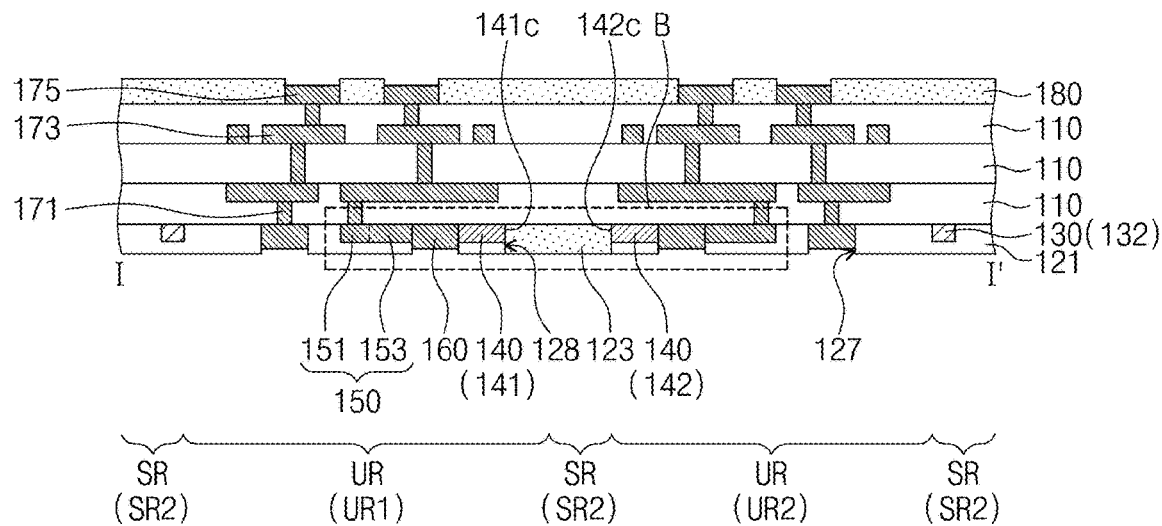
FIG. 1C illustrates a cross-sectional view taken along line I-I' of FIG. 1B.
Figure 1C:
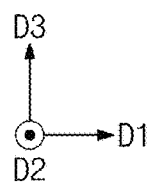
Figure 1D:
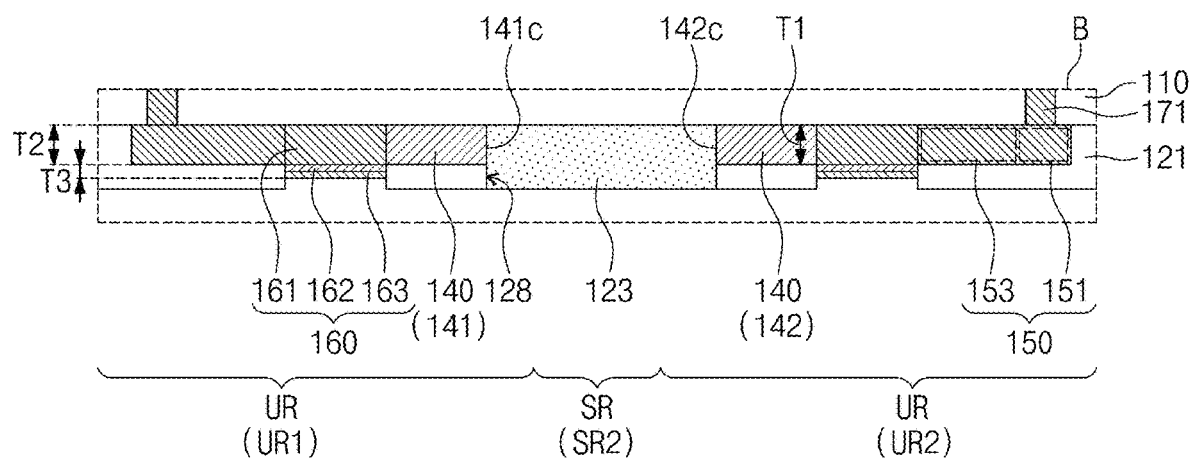
FIG. 1D illustrates an enlarged view showing section B of FIG. 1C.
Figure 1D:
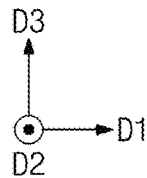
Figure 1E:
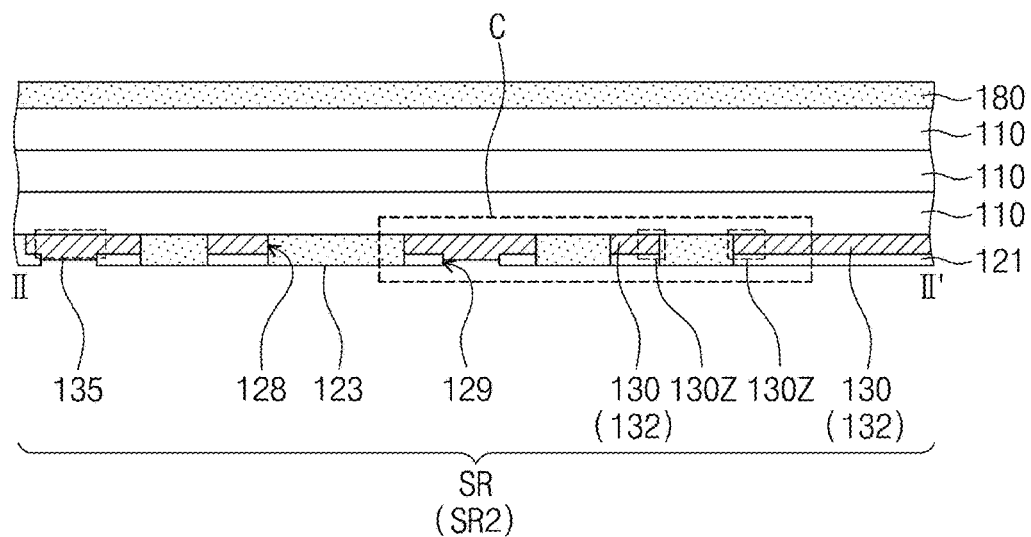
FIG. 1E illustrates a cross-sectional view taken along line II-II' of FIG. 1B.
Figure 1E:
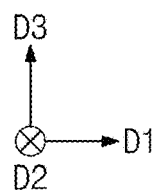
Figure 1F:
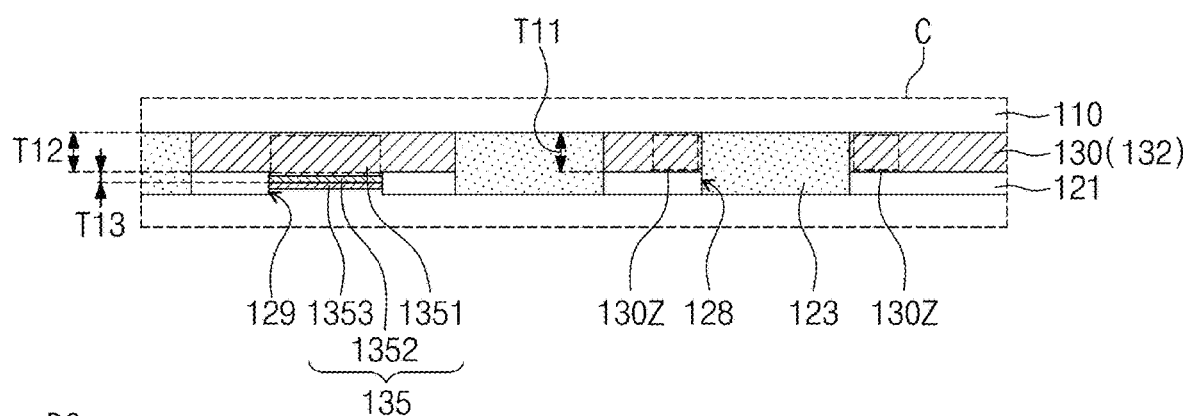
FIG. 1F illustrates an enlarged view showing section C of FIG. 1E.
Figure 1F:
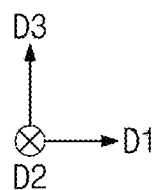

FIG. 1A illustrates a plan view showing a strip substrate according to some example embodiments. FIG. 1B illustrates an enlarged view showing section A of FIG. 1A. FIG. 1C illustrates a cross-sectional view taken along line I-I' of FIG. 1B. FIG. 1D illustrates an enlarged view showing section B of FIG. 1C. FIG. 1E illustrates a cross-sectional view taken along line II-II' of FIG. 1B. FIG. 1F illustrates an enlarged view showing section C of FIG. 1E.

Referring to FIGS. 1A, 1B, 1C, 1D, 1E, and 1F, a strip substrate 100 may include a dielectric layer 110, a saw line pattern 130, solder pads 160, wiring patterns 150, conductive dummy patterns 140, a dielectric passivation layer 121, and a protection pattern 123.

When viewed as shown in FIGS. 1A and 1B, the dielectric layer 110 may have unit regions UR and a saw line region SR. The unit regions UR may be spaced apart from each other in a first direction D1 and a second direction D2. For example, the unit regions UR may be arranged along rows parallel to the first direction D1 and along columns parallel to the second direction D2. The first direction D1 may be parallel to a bottom surface of the dielectric layer 110. The second direction D2 may intersect the first direction D1 while being parallel to the bottom surface of the dielectric layer 110. A third direction D3 may be substantially perpendicular to the bottom surface of the dielectric layer 110, and may intersect the first direction D1 and the second direction D2. Each of the unit regions UR may be a region that is used as a semiconductor package substrate. As shown in FIG. 1B, the unit regions UR may include a first unit region UR1 and a second unit region UR2. The first unit region UR1 and the second unit region UR2 may neighbor each other. The second unit region UR2 may be spaced apart from the first unit region UR1 in a direction parallel to the first direction D1. The first unit region UR1 may be provided in plural, and the plurality of first unit regions UR1 may be arranged along columns. The first unit regions UR1 may be spaced apart from each other in a direction parallel to the second direction D2. The second unit region UR2 may be provided in plural, and the plurality of second unit regions UR2 may be arranged along columns. The second unit regions UR2 may be spaced apart from each other in a direction parallel to the second direction D2. For brevity of description, the following will discuss a single first unit region UR1 and a single second unit region UR2 that neighbors the first unit region UR1.

The saw line region SR may enclose, for example, each of the unit regions UR. A portion of the saw line region SR may be disposed between the unit regions UR. The saw line region SR may be an imaginary area. The saw line region SR may be an area which will be removed in a sawing process discussed below in FIGS. 7A and 7B. The saw line region SR may include first saw line regions SR1 and second saw line regions SR2. The first saw line regions SR1 may extend in a direction parallel to the first direction D1. The first saw line regions SR1 may be spaced apart from each other in the second direction D2. The second saw line regions SR2 may extend in a direction parallel to the second direction D2. The second saw line regions SR2 may be spaced apart from each other in the first direction D1. The second saw line regions SR2 may be connected to the first saw line regions SR1. At least one of the second saw line regions SR2 may be provided between the first unit region UR1 and the second unit region UR2.

The saw line pattern 130 may be disposed on the saw line region SR of the dielectric layer 110. The saw line pattern 130 may include first saw line patterns 131, second saw line patterns 132, and marker patterns 135. The first saw line patterns 131 may be provided on corresponding first saw line regions SR1. Each of the first saw line patterns 131 may have a major axis parallel to the first direction D1. The first saw line patterns 131 may be spaced apart from each other in the second direction D2. The first saw line patterns 131 may have their lengths the same as or less than those of the first saw line regions SR1. A length of a certain component may be measured in a direction parallel to the second direction D2.

The second saw line pattern 132 may be provided on each of the second saw line regions SR2. The second saw line patterns 132 may have their widths W2 the same as or less than widths W1 of the first saw line regions SR1. A width of a certain component may be measured in a direction parallel to the first direction D1. Each of the second saw line patterns 132 may have a major axis parallel to the second direction D2. A plurality of second saw line patterns 132 may be provided on each of the second saw line regions SR2. On a single second saw line region SR2, the second saw line patterns 132 may be aligned in the second direction D2. On the single second saw line region SR2, neighboring second saw line patterns 132 may have their ends 130Z that face each other. The ends 130Z of the second saw line patterns 132 may be spaced apart from each other in a direction parallel to the second direction D2. On the single second saw line region SR2, neighboring second saw line patterns 132 may have lateral surfaces at their ends 130Z. The lateral surfaces of the ends 130Z of the second saw line patterns 132 may be spaced apart from each other while facing each other.

The second saw line patterns 132 may include the same material as that of the first saw line patterns 131. For example, the first and second saw line patterns 131 and 132 may include a first metal such as copper.

The marker patterns 135 may be provided on intersections between the first saw line patterns 131 and the second saw line patterns 132. The marker patterns 135 may have their cross shapes when viewed in plan. The marker patterns 135 may be connected without boundaries to the first saw line patterns 131 and the second saw line patterns 132. The marker patterns 135 may include the same material as that of the first and second saw line patterns 131 and 132. For example, the marker patterns 135 may include the first metal.

The solder pads 160 may be disposed on the unit regions UR of the dielectric layer 110. The solder pads 160 may be disposed laterally spaced apart from the saw line pattern 130. In this description, the expression "disposed laterally" may mean "disposed in the first direction D1, in a direction opposite to the first direction D1, in the second direction D2, or in a direction opposite to the second direction D2." The solder pads 160 may include a metallic material, such as copper, gold, nickel, or any alloy thereof.

The wiring patterns 150 may be disposed on corresponding unit regions UR of the dielectric layer 110. The wiring patterns 150 may not be disposed on the saw line region SR. The wiring patterns 150 may be disposed laterally spaced apart from the saw line pattern 130. The wiring patterns 150 may be electrically connected to corresponding solder pads 160. Although the wiring patterns 150 are illustrated separately from the solder pads 160 connected thereto, each of the wiring patterns 150 may be connected to the corresponding solder pad 160 with no boundary therebetween. The wiring patterns 150 may include wiring line parts 153 and via pad parts 151. The wiring line parts 153 of the wiring patterns 150 may be correspondingly disposed between the solder pads 160 and the via pad parts 151. The solder pads 160 may be electrically connected through the wiring line parts 153 to the via pad parts 151. The wiring line parts 153 of the wiring patterns 150 may include the same material as that of the via pad parts 151. Each of the wiring line parts 153 of the wiring patterns 150 may be connected to the corresponding via pad part 151 with no boundary therebetween. The wiring patterns 150 may include, for example, the first metal.

The conductive dummy patterns 140 may be disposed on corresponding unit regions UR of the dielectric layer 110. The conductive dummy patterns 140 may not be provided on the saw line region SR. For example, when viewed in plan, the conductive dummy patterns 140 may be disposed laterally spaced apart from the saw line pattern 130. On one of the unit regions UR, each of the conductive dummy patterns 140 may be electrically connected to a corresponding solder pad 160 and a corresponding wiring pattern 150. For example, one of the conductive dummy patterns 140 may be directly electrically connected to a corresponding solder pad 160. The one of the conductive dummy patterns 140 may be electrically connected through the corresponding solder pad 160 to a corresponding wiring pattern 150. Another of the conductive dummy patterns 140 may be electrically connected through the wiring pattern 150 to the solder pad 160. In this description, the phrase "two components are electrically connected/coupled to each other" may include "the two components are directly connected/coupled to each other" or "the two components are indirectly connected to each other through other conductive component(s)." Each of the conductive dummy patterns 140 may be disposed between the saw line region SR and the solder pad 160 that is electrically to the each of the conductive dummy patterns 140. Each of the conductive dummy patterns 140 may be disposed between the saw line region SR and the wiring pattern 150 that is electrically to the each of the conductive dummy patterns 140. A value of about 100 μm to about 150 μm may be given as a distance D between the saw line region SR and the conductive dummy patterns 140. The conductive dummy patterns 140 may include a metallic material, such as copper.

The conductive dummy patterns 140 may include a first conductive dummy pattern 141 and a second conductive dummy pattern 142. The first conductive dummy pattern 141 and the second conductive dummy pattern 142 may be respectively disposed on the first unit region UR1 and the second unit region UR2. The first conductive dummy pattern 141 may be electrically connected to a corresponding solder pad 160 and a corresponding wiring pattern 150 on the first unit region UR1. The second conductive dummy pattern 142 may be electrically connected to a corresponding solder pad 160 and a corresponding wiring pattern 150 on the second unit region UR2. The first conductive dummy pattern 141 and the second conductive dummy pattern 142 may be adjacent to each other. For example, the second conductive dummy pattern 142 may have a second sidewall 142c that faces and is spaced apart from a first sidewall 141c of the first conductive dummy pattern 141. The first conductive dummy pattern 141 may have the first sidewall 141c at a first end thereof. The second conductive dummy pattern 142 may have the second sidewall 142c at a second end thereof. The second end of the second conductive dummy pattern 142 may be aligned in the first direction D1 with the first end of the first conductive dummy pattern 141, and may be spaced apart in a direction parallel to the first direction D1 from the first end of the first conductive dummy pattern 141. The first and second ends respectively of the first and second conductive dummy patterns 141 and 142 may extend in the first direction D1.

None of the second saw line patterns 132 may be provided between the conductive dummy patterns 140. For example, the second saw line patterns 132 may not be interposed between the first sidewall 141c of the first conductive dummy pattern 141 and the second sidewall 142c of the second conductive dummy pattern 142.

The first conductive dummy pattern 141 may be provided in plural. The plurality of first conductive dummy patterns 141 may have their first sidewalls 141c that are aligned with each other in the second direction D2. The second conductive dummy pattern 142 may be provided in plural. The plurality of second conductive dummy patterns 142 may have their second sidewalls 142c that are aligned with each other in the second direction D2. The conductive dummy patterns 140 may be residues of plating bars. The conductive dummy patterns 140 may not participate in electrical connection between the solder pads 160 and metal pads 175 which will be discussed below. The following will discuss a single first conductive dummy pattern 141 and a single second conductive dummy pattern 142.

With reference to FIGS. 1C to 1F, a detailed description will be made on the dielectric layer 110, the saw line pattern 130, the solder pads 160, the wiring patterns 150, the conductive dummy patterns 140, the dielectric passivation layer 121, and the protection pattern 123, which are shown in the cross-section of the strip substrate 100.

The dielectric layer 110 may include a plurality of dielectric layers 110 that are stacked as depicted in FIG. 1C. The plurality of dielectric layers 110 may include an inorganic material such as glass fiber or an organic material such as epoxy resin.

The strip substrate 100 may further include via patterns 171, upper wiring patterns 173, and metal pads 175. The upper wiring patterns 173 may be disposed between the dielectric layers 110. The via patterns 171 may be placed in each of the dielectric layers 110, and each of the via patterns 171 may be coupled to at least one of the upper wiring patterns 173. The via patterns 171 in a lowermost dielectric layer 110 may be disposed on and coupled to corresponding via pad parts 151 of the wiring patterns 150. The metal pads 175 may be disposed on a top surface of an uppermost dielectric layer 110. The metal pads 175 may be disposed laterally spaced apart from each other and may be electrically connected to each other. The metal pads 175 may be electrically connected to corresponding via patterns 171 in the uppermost dielectric layer 110. Therefore, the metal pads 175 may be electrically connected to corresponding solder pads 160 through the upper wiring patterns 173, the via patterns 171, and the wiring patterns 150. On one of the unit regions UR of the dielectric layer 110, a pitch of the metal pads 175 may be different from that of the solder pads 160. For example, the pitch of the metal pads 175 may be less than that of the solder pads 160. The upper wiring patterns 173 and the via patterns 171 may include the first metal. The metal pads 175 may include a conductive material, such as copper, titanium, nickel, gold, or any alloy thereof.

The strip substrate 100 may further include an upper passivation layer 180. The upper passivation layer 180 may be disposed on the top surface of the upper dielectric layer 110, and may expose top surfaces of the metal pads 175. In addition, the upper passivation layer 180 may cover lateral surfaces of the metal pads 175. The upper passivation layer 180 may include a dielectric material, such as solder resist material. The solder resist material may include polymer or resin, but inventive concepts are not limited thereto.

The conductive dummy patterns 140, the wiring patterns 150, the solder pads 160, and the saw line pattern 130 may be disposed on a bottom surface of the lowermost dielectric layer 110. The conductive dummy patterns 140 may have top surfaces substantially coplanar with those of the wiring patterns 150, those of the solder pads 160, and that of the saw line pattern 130. As shown in FIG. 1D, the conductive dummy patterns 140 may have first thickness T1. The first thickness T1 may range from about 10 μm to about 20 μm. The first thickness T1 may be substantially the same as thicknesses of the wiring patterns 150 and thicknesses of the first saw line patterns 131. A thickness of a certain component may be measured in a direction parallel to the third direction D3. The phrase "certain components are the same in terms of thickness, level, width, or length" may include an allowable tolerance possibly occurring during fabrication process.

The solder pads 160 may have a second thickness T2. The second thickness T2 may be greater than the first thickness T1, the thicknesses of the wiring patterns 150, and the thicknesses of the first saw line patterns 131. As shown in FIG. 1D, each of the solder pads 160 may include a first solder pad 161, a second solder pad 162, and a third solder pad 163 that are stacked. The first solder pad 161 may be disposed on the bottom surface of the lowermost dielectric layer 110, and may be electrically connected to the wiring pattern 150 and the conductive dummy pattern 140. For example, the first solder pad 161 may be connected with no boundary to at least one of the wiring pattern 150 and the conductive dummy pattern 140. The first solder pad 161 and the conductive dummy pattern 140 are illustrated separately from each other, and the solder pad 160 and the conductive dummy pattern 140 are illustrated separately from each other, but inventive concepts are not limited thereto. The first solder pad 161 may include the same material as that of the first and second saw line patterns 131 and 132, the conductive dummy pattern 140, and the wiring patterns 150. For example, the first solder pad 161 may include the first metal. The first solder pad 161 may have a thickness substantially the same as the first thickness T1.

The second solder pad 162 may be disposed on a bottom surface of the first solder pad 161. The second solder pad 162 may include a second metal different from the first metal. For example, the second solder pad 162 may include nickel. Thus, the second solder pad 162 may include a different material from those of the saw line pattern 130, the conductive dummy pattern 140, and the wiring patterns 150. The second solder pad 162 may serve as an adhesive layer to attach the third solder pad 163 to the first solder pad 161. The second solder pad 162 may have a thickness less than the first thickness T1. The thickness of the second solder pad 162 may range from about 2 μm to about 10 μm.

The third solder pad 163 may include a third metal different from the first metal and the second metal. For example, the third metal may include gold. The third solder pad 163 may limit and/or prevent damage to the first solder pad 161. The third solder pad 163 may have a thickness less than that of the second solder pad 162. For example, the thickness of the third solder pad 163 may range from about 0.3 μm to about 0.6 μm.

The second thickness T2 may be the same as a sum of the thicknesses of the first, second, and third solder pads 161, 162, and 163. A difference T3 between the second thickness T2 and the first thickness T1 may be the same as a sum of the thickness of the second solder pad 162 and the thickness of the third solder pad 163. For example, the difference T3 between the second thickness T2 and the first thickness T1 may range from about 2.3 μm to about 10.6 μm. The solder pad 160 may have a bottom surface at a lower level than that of bottom surfaces of the conductive dummy patterns 140. The bottom surface of the solder pad 160 may correspond to that of the third solder pad 163. In this description, the term "level" may indicate "vertical level", and the language "vertical" may denote "parallel to the third direction D3." A difference in level between two planes may be measured in a direction parallel to the third direction D3. For brevity, the first solder pad 161, the second solder pad 162, and the third solder pad 163 are not illustrated separately from each other in drawings except for FIG. 1D, but inventive concepts are not limited thereto.

The dielectric passivation layer 121 may be provided on the bottom surface of the dielectric layer 110. For example, the dielectric passivation layer 121 may be provided on the unit regions UR and the saw line region SR of the dielectric layer 110. The dielectric passivation layer 121 may cover the wiring patterns 150, the conductive dummy patterns 140, and the first saw line patterns 131. For example, the dielectric passivation layer 121 may cover bottom surfaces and sidewalls of the wiring patterns 150, bottom surfaces of the conductive dummy patterns 140, and bottom surfaces and sidewalls of the first saw line patterns 131. The dielectric passivation layer 121 may have a pad opening 127. The pad opening 127 may expose the solder pad 160. For example, the pad opening 127 may expose the third solder pad 163. The third solder pad 163 may limit and/or prevent the first solder pad 161 from being externally exposed. Therefore, the first solder pad 161 may be limited and/or prevented from being damaged caused by impurities such as oxygen or moisture. The dielectric passivation layer 121 may include a material the same as or similar to that of the upper passivation layer 180. The dielectric passivation layer 121 may include, for example, a solder resist material.

As shown in FIG. 1F, the ends 130Z of the second saw line patterns 132 may be spaced apart from each other in a direction parallel to the second direction D2. The second saw line pattern 132 may have a thickness T11 substantially the same as the thickness of the first saw line pattern 131.

The marker patterns 135 may be connected to the second saw line patterns 132. The marker pattern 135 may have a thickness T12 greater than the thickness T11 of the second saw line pattern 132. A value of about 2.3 μm to about 10.6 μm may be given as a difference T13 between the thickness T12 of the marker pattern 135 and the thickness T11 of the second saw line pattern 132. The difference T13 between the thickness T12 of the marker pattern 135 and the thickness T11 of the second saw line pattern 132 may be substantially the same as the difference T3, as shown in FIG. 1D, between the second thickness T2 and the first thickness T2. The marker patterns 135 may have their bottom surfaces at a lower level than that of bottom surfaces of the second saw line patterns 132. The thickness T12 of the marker pattern 135 may be substantially the same as the second thickness T2 of FIG. 1D and greater than the first thickness T1 of FIG. 1D.

As shown in FIG. 1F, each of the marker patterns 135 may include a first marker pattern 1351, a second marker pattern 1352, and a third marker pattern 1353 that are stacked. The first marker pattern 1351 may be disposed on the bottom surface of the lowermost dielectric layer 110. The first marker pattern 1351 may be connected with no boundary to the first and second saw line patterns 131 and 132. The first marker pattern 1351 may include the first metal. The first marker pattern 1351 may have a thickness substantially the same as the thickness T11 of the second saw line pattern 132 and the first thickness (see T1 of FIG. 1D).

The second marker pattern 1352 may be disposed on a bottom surface of the first marker pattern 1351. The second marker pattern 1352 may serve as an adhesive layer. The second marker pattern 1352 may include the second metal. The second marker pattern 1352 may have a thickness substantially the same as that of the second solder pad 162 depicted in FIG. 1D.

The third marker pattern 1353 may be disposed on a bottom surface of the second marker pattern 1352. The third marker pattern 1353 may include a third metal. The third marker pattern 1353 may limit and/or prevent damage to the first marker pattern 1351. The third marker pattern 1353 may have a thickness substantially the same as that of the third solder pad 163 depicted in FIG. 1D.

The difference T13 between the thickness T12 of the marker pattern 135 and the thickness T11 of the second saw line pattern 132 may be substantially the same as a sum of the thickness of the second marker pattern 1352 and the thickness of the third marker pattern 1353.

The dielectric passivation layer 121 may cover the bottom surfaces of the second saw line patterns 132. The dielectric passivation layer 121 may further have marker openings 129. The marker openings 129 may correspondingly expose the bottom surfaces of the marker patterns 135. For example, each of the marker openings 129 may expose a corresponding third marker pattern 1353. The third marker pattern 1353 may have a bottom surface that corresponds to that of the marker pattern 135. For brevity, the first marker pattern 1351, the second marker pattern 1352, and the third marker pattern 1353 are not illustrated separately from each other in drawings except for FIG. 1F, but inventive concepts are not limited thereto.

The dielectric passivation layer 121 may further have openings 128. As shown in FIGS. 1B, 1C, and 1D, each of the openings 128 may be provided on a corresponding second saw line region SR2 of the dielectric layer 110 and on the unit regions UR adjacent to the second saw line region SR2. For example, each of the openings 128 may be provided on the first unit region UR1 and the second unit region UR2 that neighbor each other. The openings 128 may each have a width greater than a width W1 of the second saw line region SR2 that corresponds the opening 128. The openings 128 may be arranged along columns parallel to the second direction D2. On one column, the openings 128 may be spaced apart from each other in the second direction D2.

The protection patterns 123 may be provided in corresponding openings 128. The protection patterns 123 may be provided on their corresponding second saw line region SR2, their corresponding first unit region UR1, and their corresponding second unit region UR2. The protection patterns 123 may each have a width W2 greater than the width W1 of the second saw line region SR2. On one second saw line region SR2, the widths W2 of the protection patterns 123 may be substantially the same as each other. Each of the protection patterns 123 may be provided between ends of the conductive dummy patterns 140 and between the ends 130Z of the second saw line patterns 132. For example, at least one of the protection patterns 123 may be provided between the first sidewall 141c of the first conductive dummy pattern 141 and the second sidewall 142c of the second conductive dummy pattern 142, and between the ends 130Z of the second saw line patterns 132. The protection pattern 123 may cover the first sidewall 141c of the first conductive dummy pattern 141, the second sidewall 142c of the second conductive dummy pattern 142, and sidewalls of the ends 130Z of the second saw line patterns 132. Each of the conductive dummy patterns 140 may be encapsulated by a corresponding protection pattern 123 and the dielectric passivation layer 121. Therefore, the conductive dummy patterns 140 may be limited and/or prevented from being damaged.

The protection patterns 123 may include difference materials from each other. The protection patterns 123 may include a dielectric material, such as solder resist material. For example, the protection patterns 123 may include a solder resist material whose kind is different from that of the solder resist material included in the dielectric passivation layer 121.

Figure 2A:
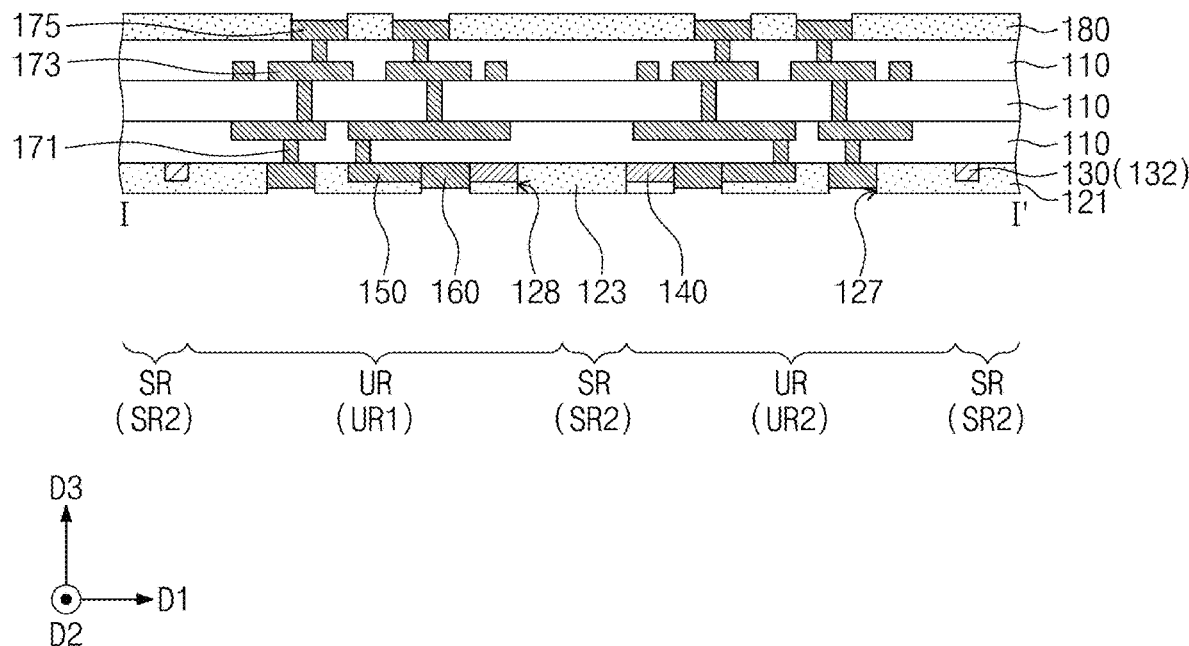
FIGS. 2A and 2B illustrate cross-sectional views showing a strip substrate according to some example embodiments.
Figure 2B:
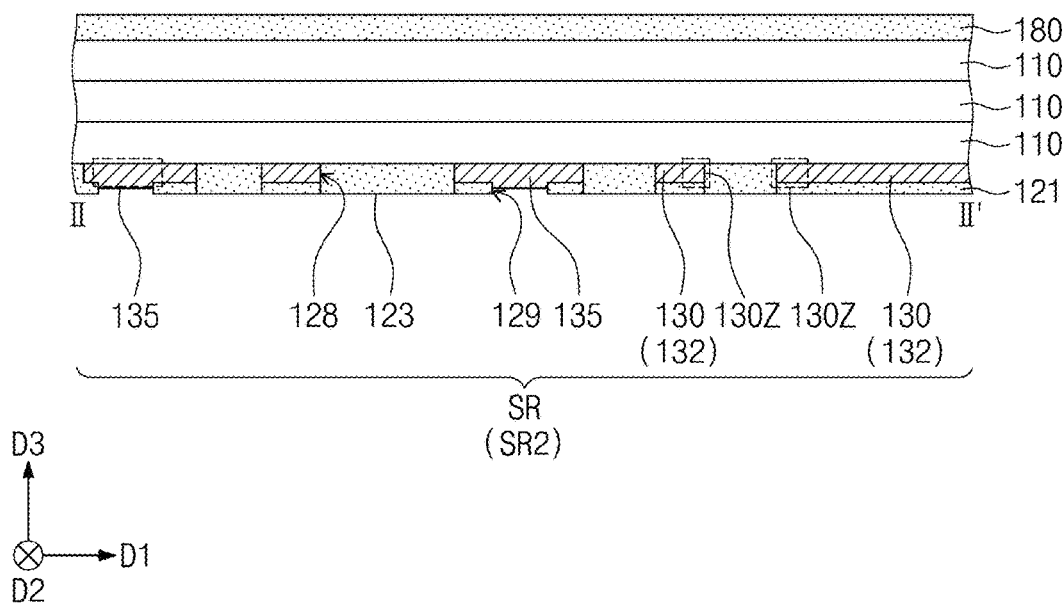

FIGS. 2A and 2B illustrate cross-sectional views showing a strip substrate according to some example embodiments. FIG. 2A corresponds to a cross-section taken along line I-I' of FIG. 1B, and FIG. 2B corresponds to a cross-section taken along line II-II' of FIG. 1B. A duplicate description will be omitted below.

Referring to FIGS. 2A and 2B, a strip substrate 101 may include a dielectric layer 110, a saw line pattern 130, solder pads 160, wiring patterns 150, conductive dummy patterns 140, a dielectric passivation layer 121, and protection patterns 123. The dielectric passivation layer 121 may include a solder resist material the same as that of the protection patterns 123. Each of the protection patterns 123 may be connected to the dielectric passivation layer 121 with no boundary therebetween.

Figure 3A:
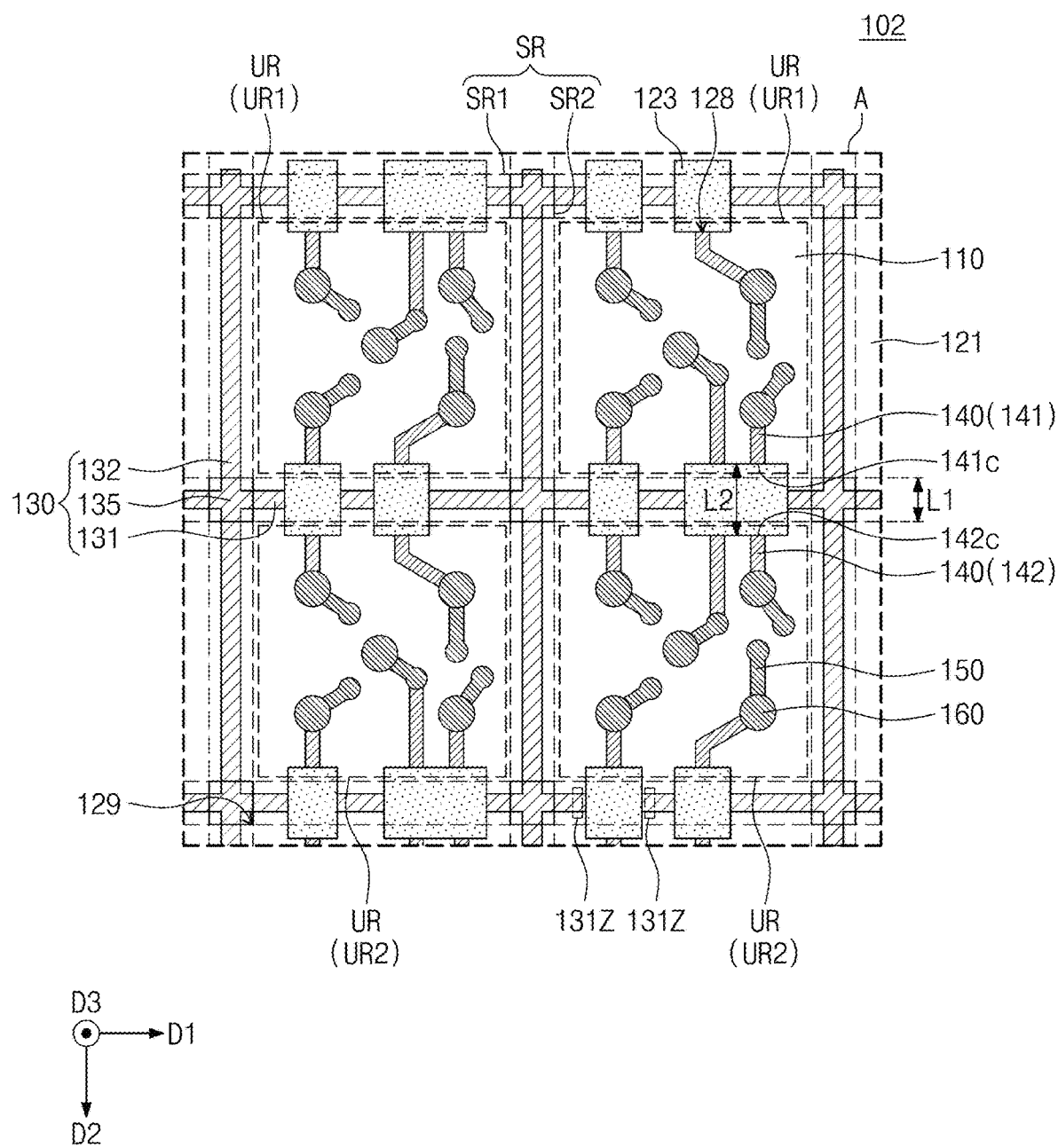
FIG. 3A illustrates a plan view showing a strip substrate according to some example embodiments.

FIG. 3A illustrates an enlarged plan view of section A in FIG. 1A, showing a strip substrate according to some example embodiments.

Referring to FIG. 3A, a strip substrate 101 may include a dielectric layer 110, a saw line pattern 130, solder pads 160, wiring patterns 150, conductive dummy patterns 140, and protection patterns 123. The dielectric layer 110, the saw line pattern 130, the solder pads 160, the wiring patterns 150, the conductive dummy patterns 140, and the protection patterns 123 may be substantially the same as those discussed in the examples of FIGS. 1A to 1F.

In contrast, the second unit region UR2 of the dielectric layer 110 may be spaced apart from the first unit region UR1 in a direction parallel to the second direction D2. The first unit region UR1 may be provided in plural, and the plurality of first unit region UR1 may be arranged in a row direction. The first unit regions UR1 may be spaced apart from each other in the first direction D1. The second unit region UR2 may be provided in plural, and the plurality of second unit region UR2 may be arranged in a column direction. The second unit regions UR2 may be spaced apart from each other in the first direction D1. The following will discuss a single first unit region UR1 and a single second unit region UR2 that neighbor each other.

On one first saw line region SR1, a plurality of first saw line patterns 131 may be provided. On one first saw line region SR1, the first saw line patterns 131 may be spaced apart from each other in a direction parallel to the first direction D1. On the one first saw line region SR1, neighboring first saw line patterns 131 may have their ends 131Z that face each other and are spaced apart from each other in the first direction D1. For example, neighboring first saw line patterns 131 may have their sidewalls that face each other and are spaced apart from each other.

The conductive dummy patterns 140 may be disposed on corresponding unit regions UR of the dielectric layer 110, and may be disposed laterally spaced apart from the saw line pattern 130. The conductive dummy patterns 140 may include a first conductive dummy pattern 141 and a second conductive dummy pattern 142. The first conductive dummy pattern 141 and the second conductive dummy pattern 142 may be substantially the same as those discussed in the examples of FIGS. 1B to 1F. For example, the second conductive dummy pattern 142 may neighbor the first conductive dummy pattern 141. The second sidewall 142c of the second conductive dummy pattern 142 may be spaced apart, in a direction parallel to the second direction D2, from the first sidewall 141c of the first conductive dummy pattern 141. The second sidewall 142c of the second conductive dummy pattern 142 may face the first sidewall 141c of the first conductive dummy pattern 141. The second conductive dummy pattern 142 may have an end that is aligned in the second direction D2 with an end of the first conductive dummy pattern 141. The ends of the first and second conductive dummy patterns 141 and 142 may extend in a direction parallel to the second direction D2. The first saw line patterns 131 may not be provided between the end of the first conductive dummy pattern 141 and the end of the second conductive dummy pattern 142. For example, the first saw line patterns 131 may not be interposed between the first sidewall 141c of the first conductive dummy pattern 141 and the second sidewall 142c of the second conductive dummy pattern 142.

Each of the protection patterns 123 may be provided between neighboring first saw line patterns 131 and between the first sidewall 141c of the first conductive dummy pattern 141 and the second sidewall 142c of the second conductive dummy pattern 142. The protection patterns 123 may be provided on one first saw line region SR1 and on the first and second unit regions UR1 and UR2 that are adjacent to the one first saw line region SR1. The protection patterns 123 may have their lengths L2 each of which is greater than a length L1 of the first saw line region SR1. On one first saw line region SR1, the lengths L2 of the protection patterns 123 may be the same as each other. On one first saw line region SR1, the protection patterns 123 may be spaced apart from each other in the first direction D1. The protection patterns 123 may not be provided on the second saw line regions SR2.

Figure 3B:
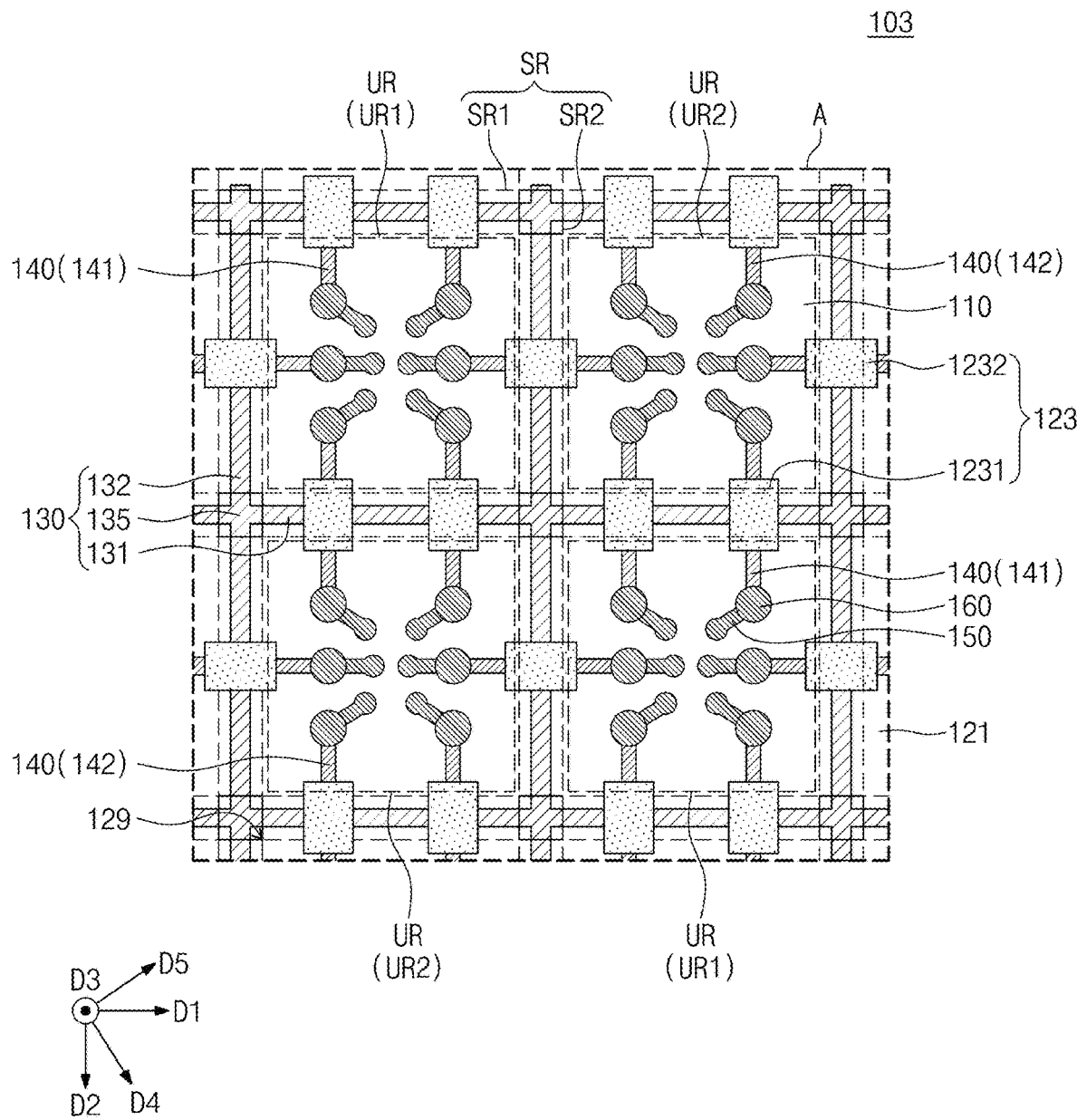
FIG. 3B illustrates a plan view showing a strip substrate according to some example embodiments.

FIG. 3B illustrates an enlarged plan view of section A in FIG. 1A, showing a strip substrate according to some example embodiments.

Referring to FIG. 3B, a strip substrate 103 may include a dielectric layer 110, a saw line pattern 130, solder pads 160, wiring patterns 150, conductive dummy patterns 140, and protection patterns 123. The unit region UR of the dielectric layer 110 may include first unit regions UR1 and second unit regions UR2. The first unit regions UR1 may be arranged in a first diagonal direction D4. The first diagonal direction D4 may be parallel to the bottom surface of the dielectric layer 110, and may intersect the first direction D1 and the second direction D2. The second unit regions UR2 may be arranged in a second diagonal direction D5. The second diagonal direction D5 may be parallel to the bottom surface of the dielectric layer 110, and may intersect the first direction D1, the second direction D2, and the first diagonal direction D4. For example, when viewed in plan, the second diagonal direction D5 may be substantially orthogonal to the first diagonal direction D4.

An arrangement of the first saw line patterns 131 may be substantially the same as that discussed in the example of FIG. 3A. For example, on one first saw line region SR1, the first saw line patterns 131 may be spaced apart from each other in a direction parallel to the first direction D1.

An arrangement of the second saw line patterns 132 may be substantially the same as that discussed in the example of FIGS. 1B to 1F. For example, on one second saw line region SR2, the second saw line patterns 132 may be spaced apart from each other in a direction parallel to the second direction D2.

The protection patterns 123 may include first protection patterns 1231 and second protection patterns 1232. An arrangement of the first protection patterns 1231 may be substantially the same as that of the protection patterns 123 depicted in FIG. 2A. For example, the first protection patterns 1231 may be disposed on corresponding first saw line regions SR1. Each of the first protection patterns 1231 may extend onto the first unit region UR1 and the second unit region UR2 that are adjacent thereto. On one first saw line region SR1, the first protection patterns 1231 may be disposed spaced apart from each other in the first direction D1.

An arrangement of the second protection patterns 1232 may be substantially the same as that of the protection patterns 123 depicted in FIGS. 1B to 1F. For example, the second protection patterns 1232 may be disposed on corresponding second saw line regions SR2. The second protection patterns 1232 may extend onto the first unit region UR1 and the second unit region UR2 that are adjacent thereto. On one second saw line region SR2, the second protection patterns 1232 may be disposed spaced apart from each other in the second direction D2.

The conductive dummy pattern 140 may be disposed laterally spaced apart from the saw line pattern 130. The conductive dummy pattern 140 may include a plurality of first conductive dummy patterns 141 and a plurality of second conductive dummy patterns 142. The first conductive dummy patterns 141 and the second conductive dummy patterns 142 may be respectively disposed on the first unit regions UR1 and the second unit regions UR2 of the dielectric layer 110. One of the first conductive dummy patterns 141 and one of the second conductive dummy patterns 142 may face each other across the second saw line region SR2. An arrangement of the one first conductive dummy pattern 141 and the one second conductive dummy pattern 142 may be the same as that discussed in the example of FIGS. 1B to 1F. A corresponding one of the second protection patterns 1232 may be provided between the one first conductive dummy pattern 141 and the one second conductive dummy pattern 142.

Another of the first conductive dummy patterns 141 and another of the second conductive dummy patterns 142 may face each other across the first saw line region SR1. An arrangement of the another first conductive dummy pattern 141 and the another second conductive dummy pattern 142 may be the same as that discussed in the example of FIG. 2A. A corresponding one of the first protection patterns 1231 may be provided between the another first conductive dummy pattern 141 and the another second conductive dummy pattern 142.

The embodiments of the strip substrates 100, 101, 102, and 103 may be combined with each other. For example, among the embodiments of FIGS. 1A to 1F, the embodiment of FIGS. 2A and 2B, the embodiment of FIG. 3A, and the embodiment of FIG. 3B, at least two embodiments may be combined with each other.

The following will discuss a method of fabricating a strip substrate according to some example embodiments.

Figure 4A:
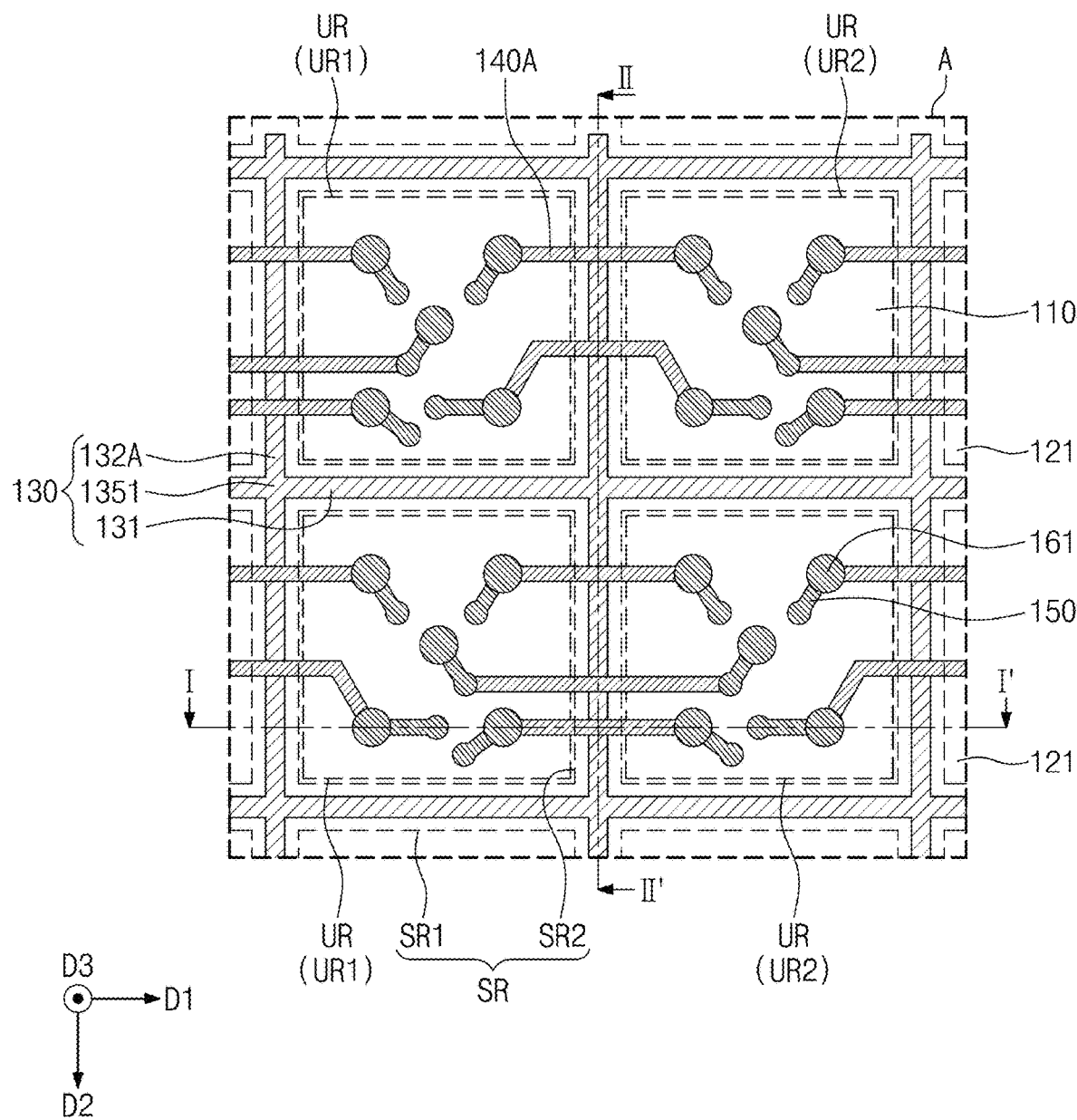
FIGS. 4A, 5A, and 6A illustrate plan views showing a method of fabricating a strip substrate according to some example embodiments.
Figure 4B:
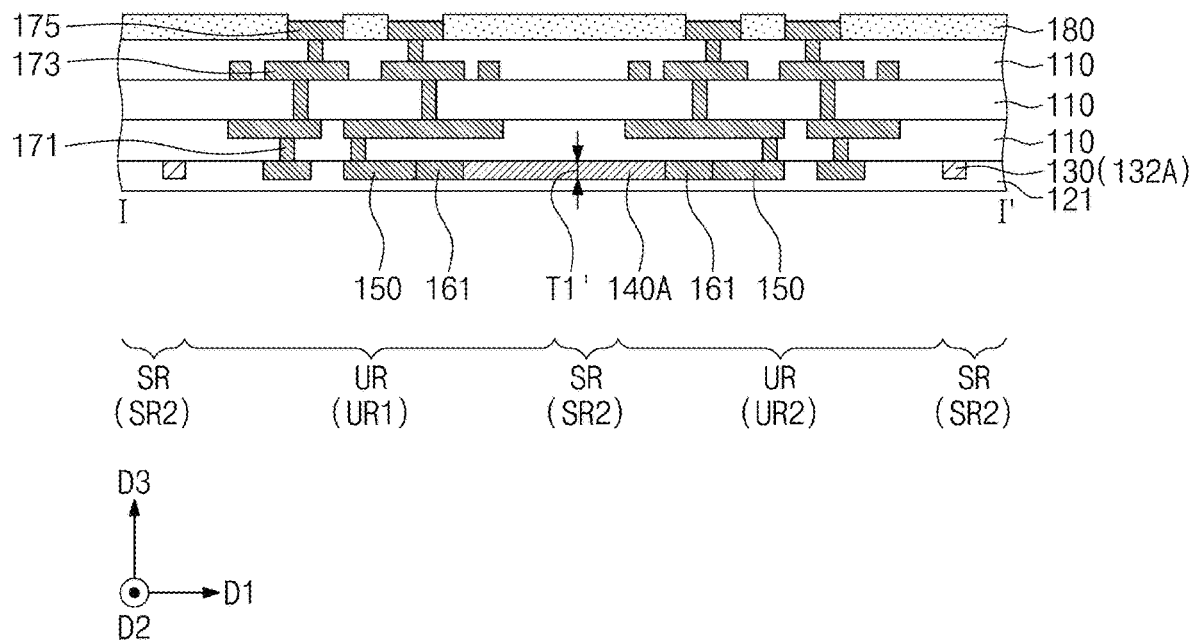
FIGS. 4B, 5B, and 6B illustrate cross-sectional views taken along line I-I' of FIGS. 4A, 5A, and 6A, respectively.
Figure 4C:
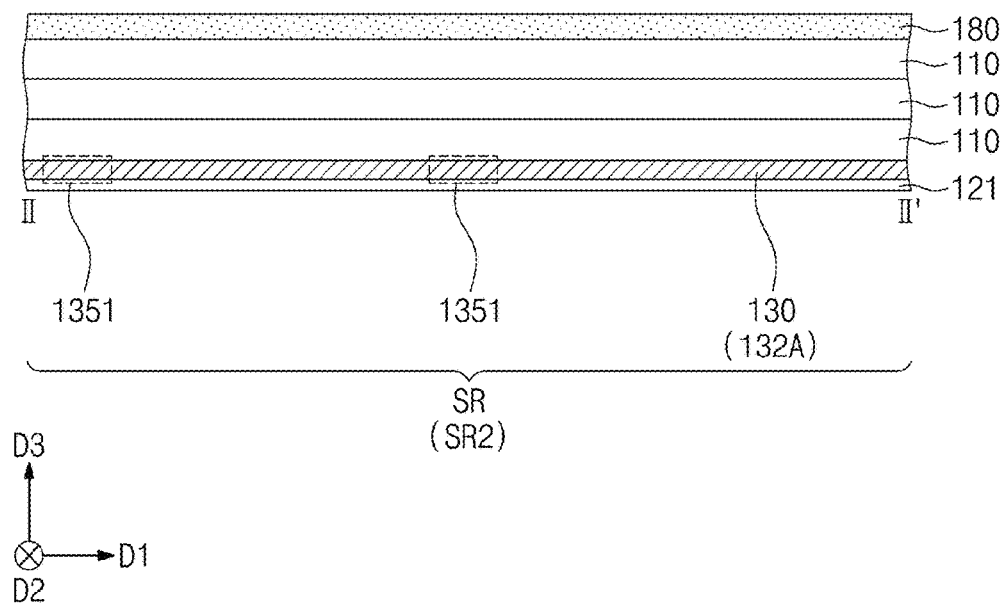
FIGS. 4C, 5C, and 6C illustrate cross-sectional views taken along line II-II' of FIGS. 4A, 5A, and 6A, respectively.
Figure 5A:
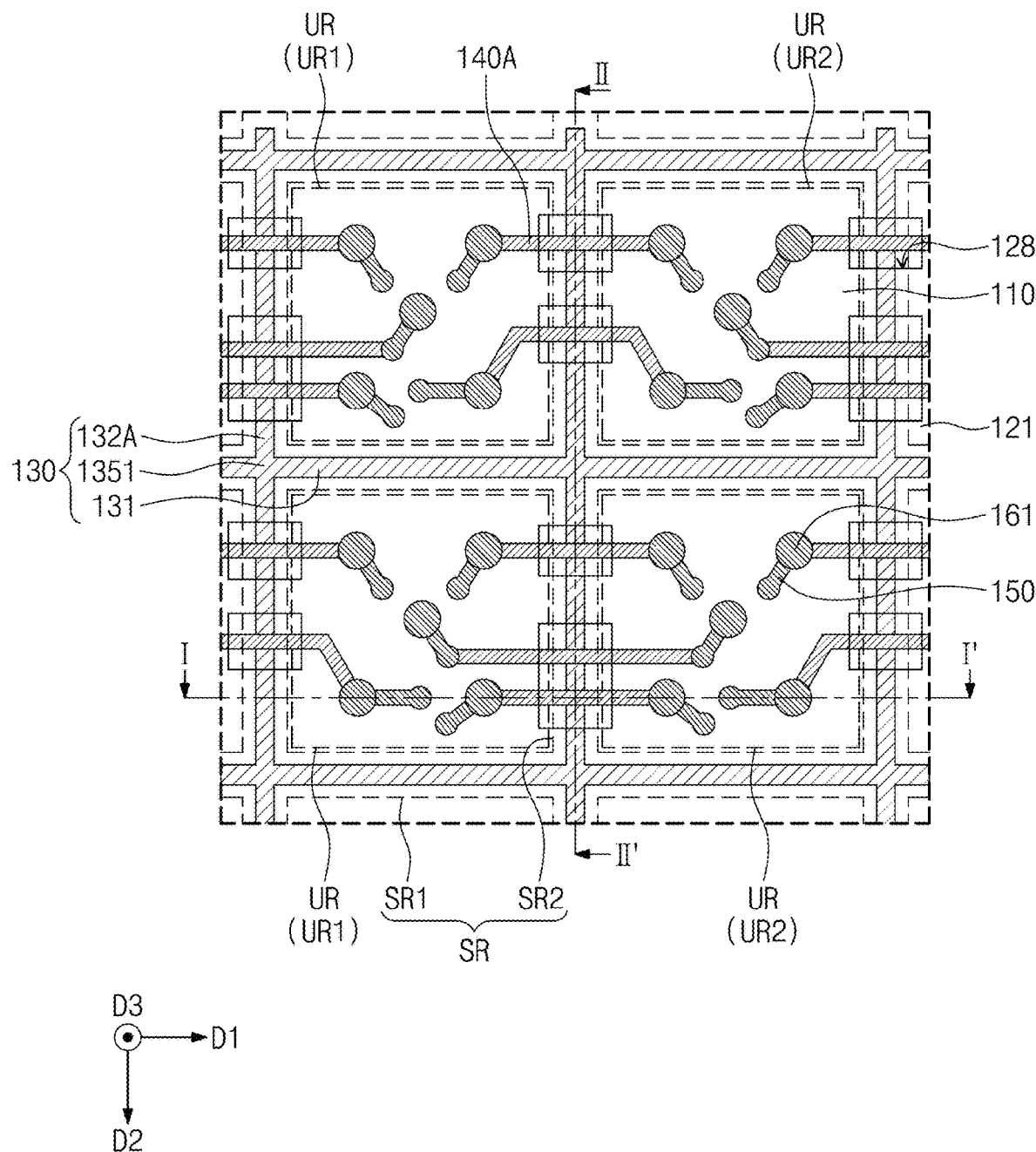
Figure 5B:
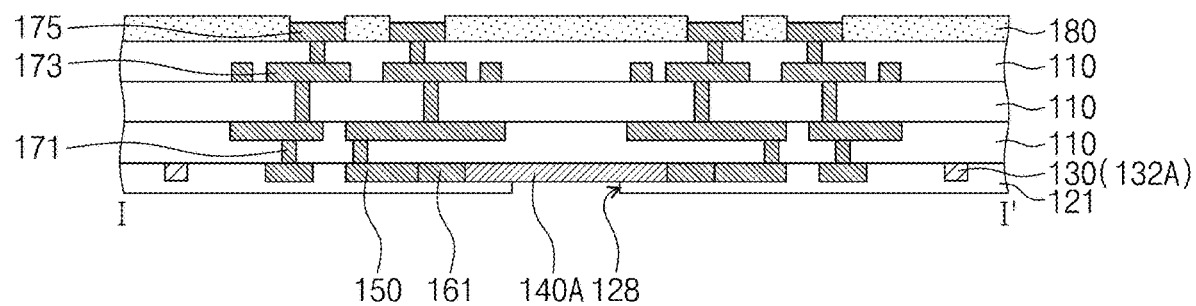
Figure 5C:
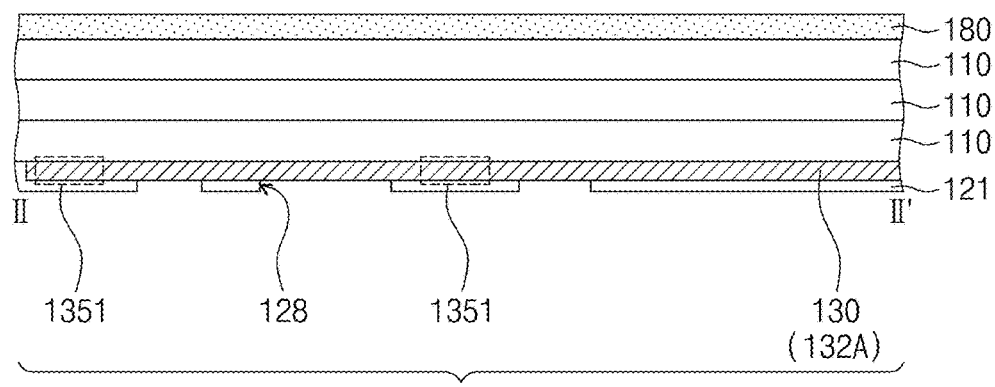
Figure 6A:
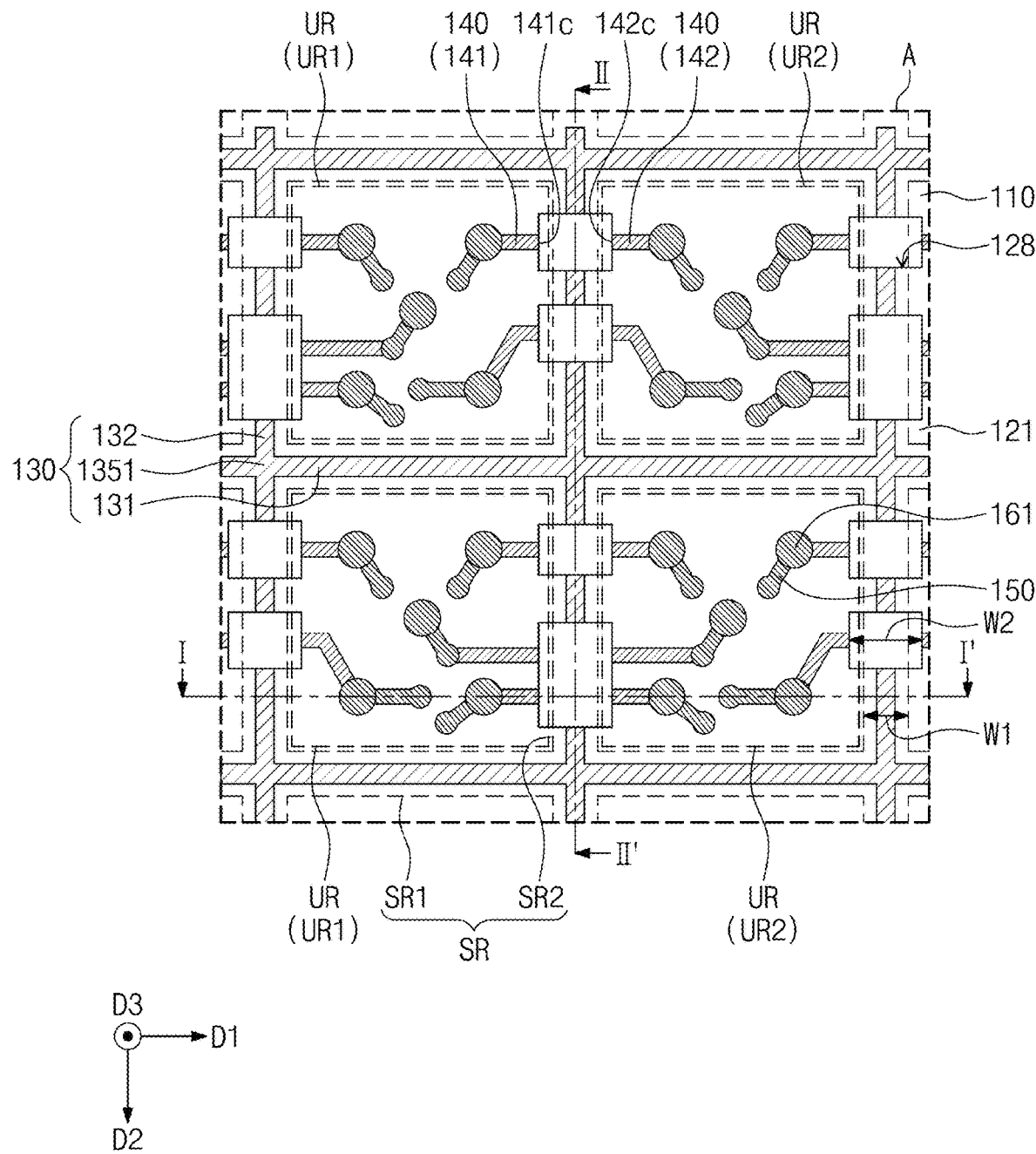
Figure 6B:
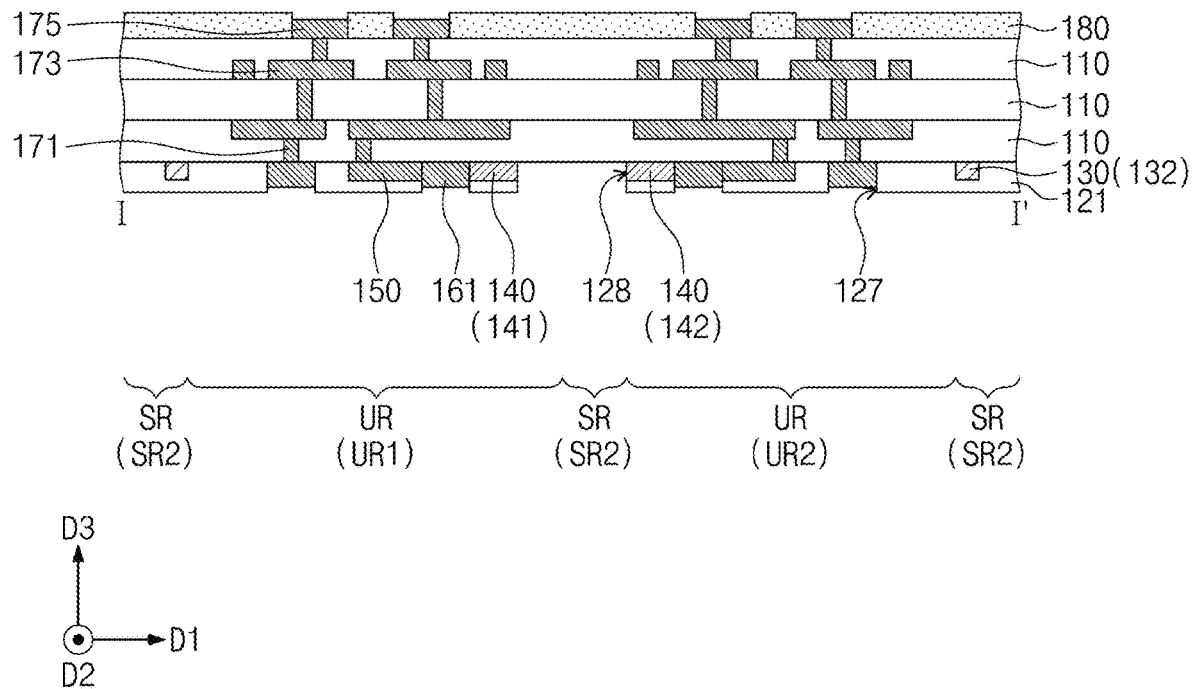
Figure 6C:
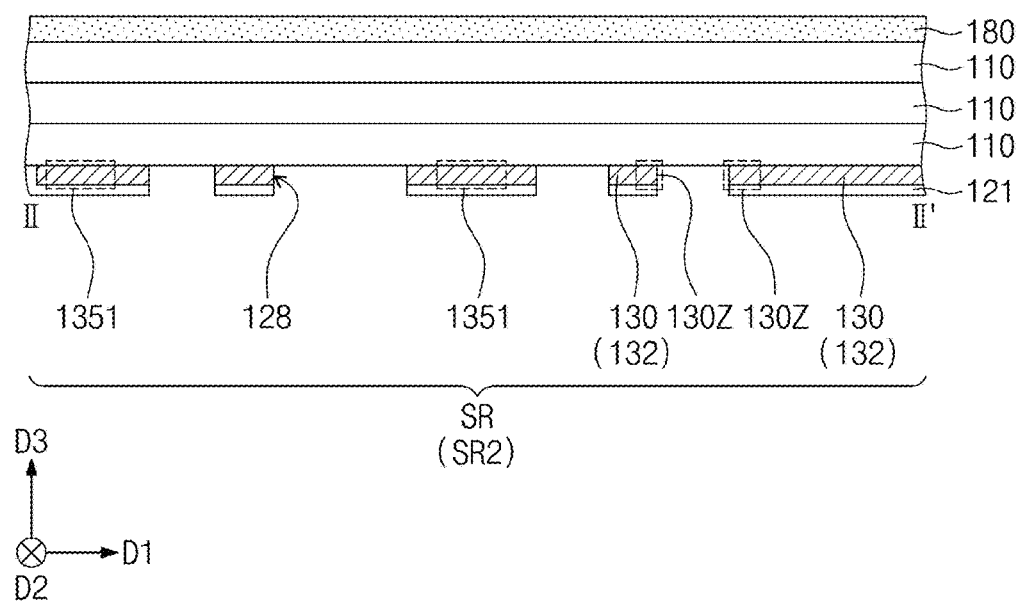

FIGS. 4A, 5A, and 6A illustrate plan views showing a method of fabricating a strip substrate according to some example embodiments. FIGS. 4B, 5B, and 6B illustrate cross-sectional views taken along line I-I' of FIGS. 4A, 5A, and 6A, respectively. FIGS. 4C, 5C, and 6C illustrate cross-sectional views taken along line II-II' of FIGS. 4A, 5A, and 6A, respectively. A duplicate description will be omitted below.

Referring to FIGS. 4A, 4B, and 4C, a preliminary strip substrate may be prepared. The preliminary strip substrate may include dielectric layers 110, upper wiring patterns 173, via patterns 171, metal pads 175, an upper passivation layer 180, a saw line pattern 130, first solder pads 161, wiring patterns 150, and conductive patterns 140A. The dielectric layers 110, the upper wiring patterns 173, the via patterns 171, the metal pads 175, the upper passivation layer 180, and the wiring patterns 150 may be substantially the same as those discussed above. In the explanation of FIGS. 4A to 6C, for brevity of description, the following will focus on a single dielectric layer 110, a single conductive pattern 140A, and a single second saw line region SR2, and the single dielectric layer 110 may indicate a lowermost dielectric layer 110.

The saw line pattern 130 may include first saw line patterns 131, preliminary saw line patterns 132A, and first marker patterns 1351. The first saw line patterns 131 may be substantially the same as those discussed above. The preliminary saw line patterns 132A may be similar to the second saw line patterns 132 discussed above. However, differently from the second saw line patterns 132, each of the preliminary saw line patterns 132A may be connected to a corresponding conductive pattern 140A. On one second saw line region SR2, the preliminary saw line patterns 132A may be connected to each other.

Each of the first solder pads 161 may be substantially the same as the first solder pad 161 discussed above in FIG. 1F. However, one or more of the second and third solder pads 162 and 163 depicted in FIG. 1F may not be disposed on the first solder pad 161.

The conductive pattern 140A may be disposed on the first and second unit regions UR1 and UR2 and the second saw line region SR2 of the dielectric layer 110. The conductive pattern 140A may have a first end electrically connected to the wiring pattern 150 or the solder pad 160 on the first unit region UR1. The conductive pattern 140A may have a second end electrically connected to the wiring pattern 150 or the solder pad 160 on the second unit region UR2. The conductive pattern 140A may have a portion having a major axis that extends in a direction parallel to the first direction D1, and the portion may be provided on the second saw line region SR2. The portion of the conductive pattern 140A may be connected to the first end and the second end.

The first solder pads 161, the wiring patterns 150, the conductive pattern 140A, and the saw line pattern 130 may be formed in a single process. For example, a plating process may be performed on a bottom surface of the dielectric layer 110 to form the first solder pads 161, the wiring patterns 150, the saw line pattern 130, and the conductive pattern 140A. The plating process may be an electroplating process. In this case, the conductive pattern 140A and the saw line pattern 130 may be plating bars. The conductive patterns 140A and the saw line pattern 130 may be formed in the plating process. During the plating process, the conductive patterns 140A and the saw line pattern 130 may be used as current supply paths for the wiring patterns 150 and the first solder pads 161. For example, when viewed in plan, current may be supplied to an edge area of the preliminary strip substrate in the plating process. For example, the current may be supplied to an end of the saw line pattern 130. The current may be transmitted through the saw line pattern 130 to the conductive pattern 140A. The conductive pattern 140A may supply the transmitted current to conductive components on the unit regions UR of the dielectric layer 110. The conductive components may include seed patterns (not shown) for the first solder pads 161 and seed patterns (not shown) for the wiring patterns 150. Therefore, the electroplating process the uses the current may form the first solder pads 161 and the wiring patterns 150 on the unit region UR of the dielectric layer 110. The conductive patterns 140A may each have a thickness T1' substantially the same as those of the first solder pads 161, those of the wiring patterns 150, and that of the saw line pattern 130. In FIG. 4A, the preliminary saw line patterns 132A are illustrated separately from the conductive pattern 140A, but each of the preliminary saw line patterns 132A may be connected to the conductive pattern 140A with no boundary therebetween. In addition, the conductive pattern 140A may be connected with no boundary to the first solder pad 161 or the wiring pattern 150.

As shown in FIG. 4C, each of the first marker patterns 1351 may be substantially the same as the first marker pattern 1351 discussed above in FIG. 1F. In contrast, neither the second marker pattern 1352 nor the third marker pattern 1353 depicted in FIG. 1F may be disposed on the first marker pattern 1351. The first marker pattern 1351 may have a thickness substantially the same as those of the preliminary saw line patterns 132A and those of the first saw line patterns 131.

A dielectric passivation layer 121 may be formed on the bottom surface of the lowermost dielectric layer 110, thereby covering the first solder pads 161, the wiring patterns 150, the first marker patterns 1351, the preliminary saw line patterns 132A, and the conductive patterns 140A.

Referring to FIGS. 5A, 5B, and 5C, openings 128 may be formed in the dielectric passivation layer 121. The openings 128 may expose the preliminary saw line patterns 132A, the conductive patterns 140A, and a bottom surface of the second saw line region SR2 of the dielectric layer 110. The opening 128, as shown in FIG. 5B, may expose a bottom surface of a portion of the conductive pattern 140A. The dielectric passivation layer 121 may cover the first and second ends of the conductive pattern 140A.

Referring to FIGS. 6A, 6B, and 6C, the preliminary saw line pattern 132A exposed to the opening 128 may be partially removed to form a plurality of second saw line patterns 132 that are divided from each other. The second saw line patterns 132 may be spaced apart from each other in the second direction D2.

The conductive pattern 140A exposed to the opening 128 may be removed to form conductive dummy patterns 140. The conductive dummy patterns 140 may include a first conductive dummy pattern 141 and a second conductive dummy pattern 142. The first conductive dummy pattern 141 and the second conductive dummy pattern 142 may be spaced apart from each other in the first direction D1. A single etching process may be performed to remove the conductive pattern 140A and also to remove a portion of the preliminary saw line pattern 132A.

The first conductive dummy pattern 141 may be spaced apart from and electrically separated from the second conductive dummy pattern 142. Therefore, the first solder pads 161 on the first unit region UR1 of the dielectric layer 110 may be electrically separated from the first solder pads 161 on the second unit region UR2 of the dielectric layer 110. The wiring patterns 150 on the first unit region UR1 may be electrically separated from the wiring patterns 150 on the second unit region UR2. Afterwards, a test action may be executed on each of the unit regions UR. The test action may test an electrical connection between components in each unit region UR.

Referring back to FIGS. 1B to 1F, a protection pattern 123 may be formed in the opening 128 of the dielectric passivation layer 121. The formation of the protection pattern 123 may include proving a liquid solder resist material into a passivation layer, and curing the liquid solder resist material. The dielectric passivation layer 121 may have a plurality of openings 128, and a plurality of protection patterns 123 may be provided in corresponding openings 128. The protection patterns 123 may include a material the same as or different from that of the dielectric passivation layer 121. The protection patterns 123 and the dielectric passivation layer 121 may be connected to each other with no boundary therebetween, but inventive concepts are not limited thereto.

As shown in FIGS. 1D and 1F, a pad opening 127 and a marker opening 129 may be formed in the dielectric passivation layer 121. As shown in FIG. 1D, the pad opening 127 may expose a corresponding first solder pad 161. As shown in FIG. 1E, the marker opening 129 may expose the first marker pattern 1351. Afterwards, a second solder pad 162 and a third solder pad 163 may be formed in the pad opening 127, thereby forming a solder pad 160. A second marker pattern 1352 and a third marker pattern 1353 may be formed in the marker opening 129, thereby forming a marker pattern 135. The second marker pattern 1352 and the second solder pad 162 may be formed in a single process. The third marker pattern 1353 and the third solder pad 163 may be formed in a single process. Through the processes mentioned above, a strip substrate 100 may be fabricated.

Figure 7A:
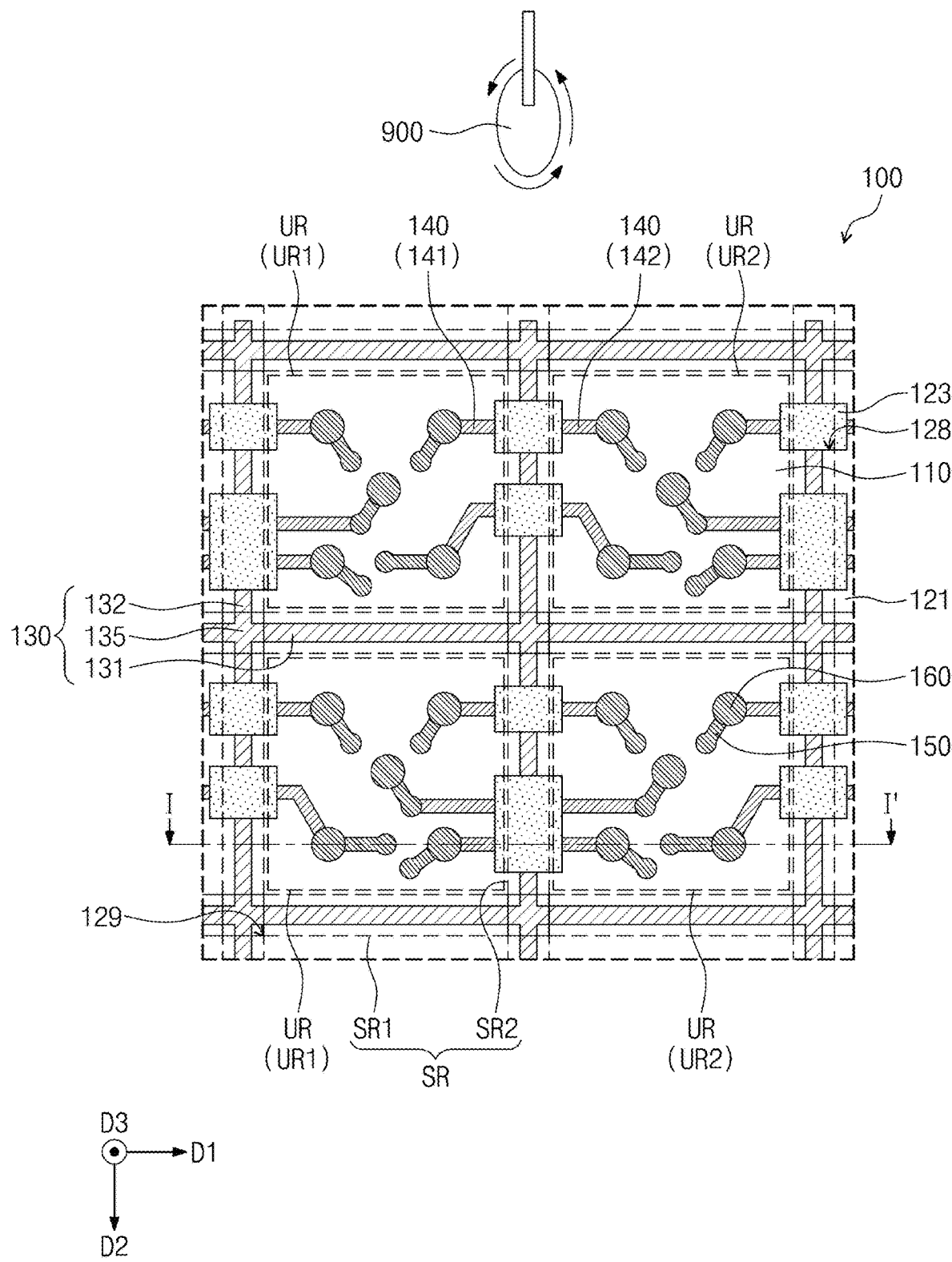
FIGS. 7A and 8A illustrate plan views showing a sawing process for a strip substrate according to some example embodiments.
Figure 8A:
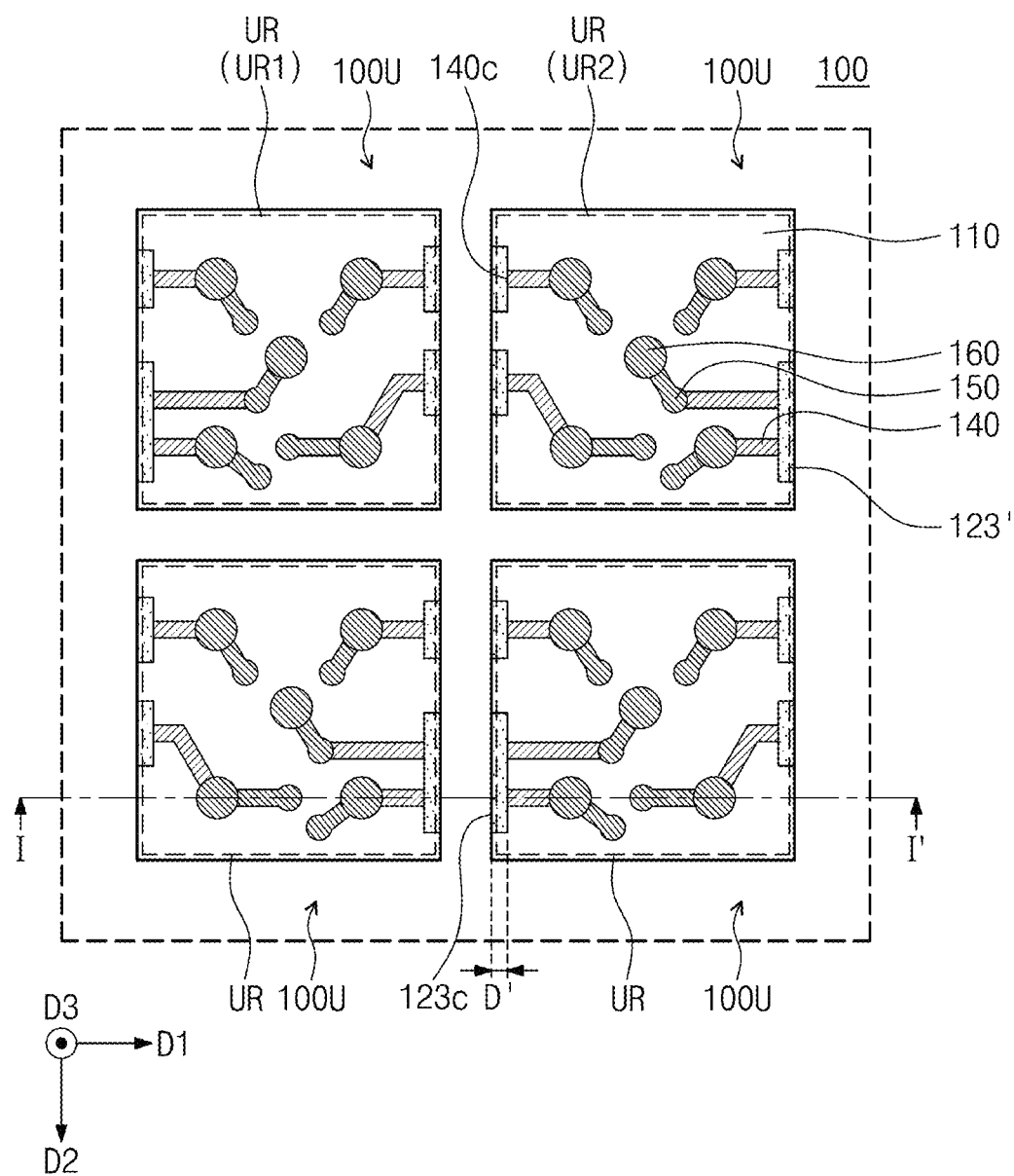
Figure 8B:
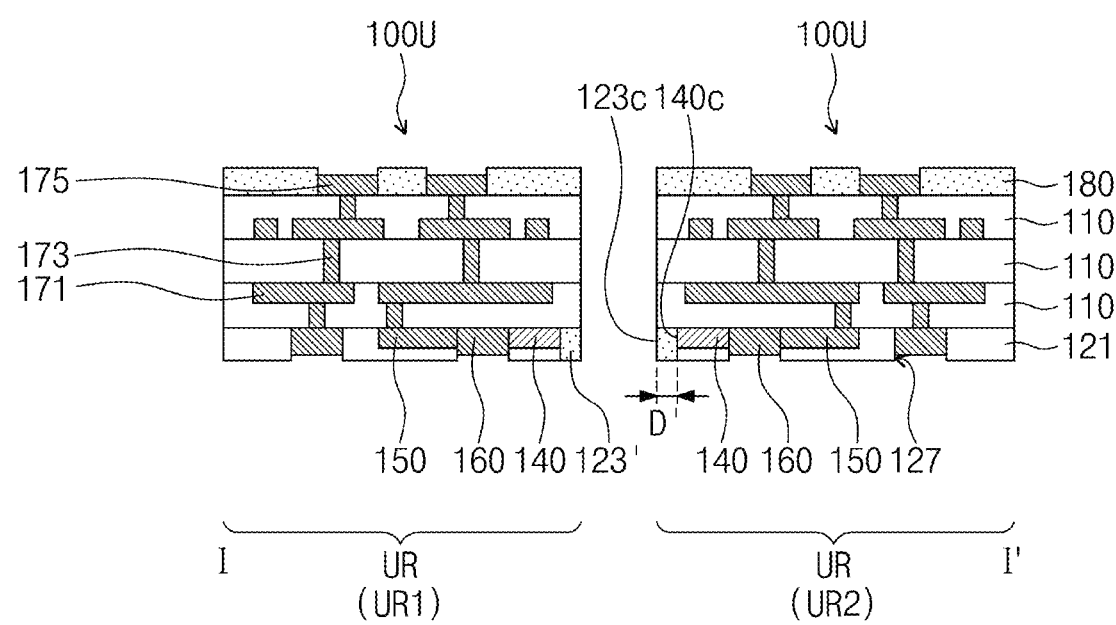
Figure 8B:
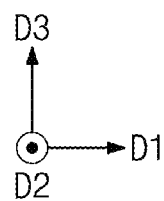

FIGS. 7A and 8A illustrate plan views showing a sawing process for a strip substrate according to some example embodiments. FIGS. 7B and 8B illustrate cross-sectional views taken along line I-I' of FIGS. 7A and 8A, respectively.

Referring to FIGS. 7A and 7B, the strip substrate 100 may undergo a sawing process to form package substrates 100U. The strip substrate 100 may be substantially the same as that discussed above in the examples of FIGS. 1B to 1F. Alternatively, the sawing process may be performed on the strip substrate 101 of FIGS. 2A and 2B, the strip substrate 102 of FIG. 3A, or the strip substrate 103 of FIG. 3B. A blade 900 may be used to perform the sawing process for the strip substrate 100, but inventive concepts are not limited thereto. The sawing process may use the marker patterns 135 to recognize the saw line region SR. The blade 900 may cut, along the saw line region SR, the protection patterns 123, the dielectric passivation layer 121, the saw line pattern 130, the dielectric layer 110, and the upper passivation layer 180. As a result of the sawing process, the saw line region SR of the dielectric layer 110 may be removed, and components on the saw line region SR may also be removed. For example, the sawing process may remove the saw line pattern 130, portions of the protection patterns 123 on the saw line region SR, a portion of the dielectric passivation layer 121, and a portion of the upper passivation layer 180. The conductive dummy pattern 140 may not be exposed to the sawing process. The sawing process may cause the unit regions UR of the dielectric layer 110 to separate from each other.

Referring to FIGS. 8A and 8B, the sawing process may form a plurality of package substrates 100U that are divided from each other. The package substrates 100U may correspond to the unit regions UR of the dielectric layer 110 of the strip substrate 100. Each of the package substrates 100U may include the dielectric passivation layer 121, the stacked dielectric layers 110, the via patterns 171, the upper wiring patterns 173, the metal pads 175, the upper passivation layer 180, a protection pattern 123', the solder pads 160, the wiring patterns 150, and the conductive dummy patterns 140. The via patterns 171, the upper wiring patterns 173, the metal pads 175, the upper passivation layer 180, the protection pattern 123', the solder pads 160, the wiring patterns 150, and the conductive dummy patterns 140 in each package substrate 100U may be components disposed on one unit region UR in the strip substrate 100. The package substrate 100U may not include the saw line pattern 130. The following will discuss a single wiring pattern 150 and a single solder pad 160.

The package substrate 100U may have a top surface, a bottom surface, and a sidewall. The sidewall of the package substrate 100U may connect an edge of the top surface to an edge of the bottom surface. The sidewall of the package substrate 100U may include outer walls of the dielectric layers 110 and an outer wall 123c of the protection pattern 123'. The outer wall 123c of the protection pattern 123' may be vertically aligned with the outer walls of the dielectric layers 110.

When viewed in plan, the conductive dummy pattern 140 may be interposed between the protection pattern 123' and the solder pad 160, and may be electrically connected to the solder pad 160. The conductive dummy pattern 140 may be interposed between the protection pattern 123' and the wiring pattern 150, and may be electrically connected to the wiring pattern 150. The conductive dummy pattern 140 may have a sidewall 140c directed toward an outer wall of the package substrate 100U. The protection pattern 123' may cover the sidewall 140c of the conductive dummy pattern 140. Therefore, the conductive dummy pattern 140 may not be exposed on the sidewall of the package substrate 100U.

Differently from the explanation in FIGS. 1A to 7B, when the opening 128 and the protection pattern 123 of the strip substrate 100 do not extend onto the unit regions UR, an end of the conductive dummy pattern 140 may be provided on the saw line region SR after the etching process discussed in FIGS. 6A, 6B, and 6C. In this case, the conductive dummy pattern 140 may be exposed on the outer wall of the package substrate 100U. The exposed portion of the conductive dummy pattern 140 may suffer from damage (e.g., corrosion). The damage of the conductive dummy pattern 140 may decrease reliability of the solder pad 160 and/or the wiring pattern 150 that are electrically connected to the conductive dummy pattern 140.

According to some example embodiments, the opening 128 may have a width greater than that of the second saw line region SR2, and may extend onto the unit region UR. The end of the conductive dummy pattern 140 may be provided on the unit region UR. The conductive dummy pattern 140 may thus not be exposed to the sawing process, and accordingly may be limited and/or prevented from being damaged.

When the protection pattern 123' is omitted, at least a portion of the conductive dummy pattern 140 may be externally exposed. For example, at least a portion of the conductive dummy pattern 140 may be exposed on a bottom surface or the outer wall of the package substrate 100U. This case may damage to the conductive dummy pattern 140. According to some example embodiments, the protection pattern 123' may be provided to cover the sidewall 140c or the bottom surface of the conductive dummy pattern 140. Therefore, the conductive dummy pattern 140 may be limited and/or prevented from being damaged. The package substrate 100U may increase in reliability.

A value of about 100 μm to about 150 μm may be given as an interval D' between the sidewall 140c of the conductive dummy pattern 140 and an outer wall 123c of the protection pattern 123'. The interval D' between the sidewall 140c of the conductive dummy pattern 140 and the outer wall 123c of the protection pattern 123' may correspond to an interval between the conductive dummy pattern 140 and the outer wall 123c of the protection pattern 123'. When the interval D' between the sidewall 140c of the conductive dummy pattern 140 and the outer wall 123c of the protection pattern 123' is less than about 100 μm, the protection pattern 123' may have difficulty in sufficiently protecting the conductive dummy pattern 140. For example, when the sawing process is performed on the strip substrate 100, the conductive dummy pattern 140 may be revealed or damaged. When the interval D' between the sidewall 140c of the conductive dummy pattern 140 and the outer wall 123c of the protection pattern 123' is greater than about 150 μm, the package substrate 100U may have difficulty in accomplishing high integration. According to some example embodiments, the interval D' between the sidewall 140c of the conductive dummy pattern 140 and the outer wall 123c of the protection pattern 123' may range from about 100 μm to about 150 μm, and therefore, it may be possible to sufficiently protect the conductive dummy pattern 140 and to achieve high integration of the package substrate 100U. The interval D' between the sidewall 140c of the conductive dummy pattern 140 and the outer wall 123c of the protection pattern 123' may correspond to a width of the protection pattern 123'.

The dielectric layers 110, the upper wiring patterns 173, the via patterns 171, the metal pads 175, the upper passivation layer 180, and the wiring patterns 150 may be substantially the same as those discussed above.

Figure 9:
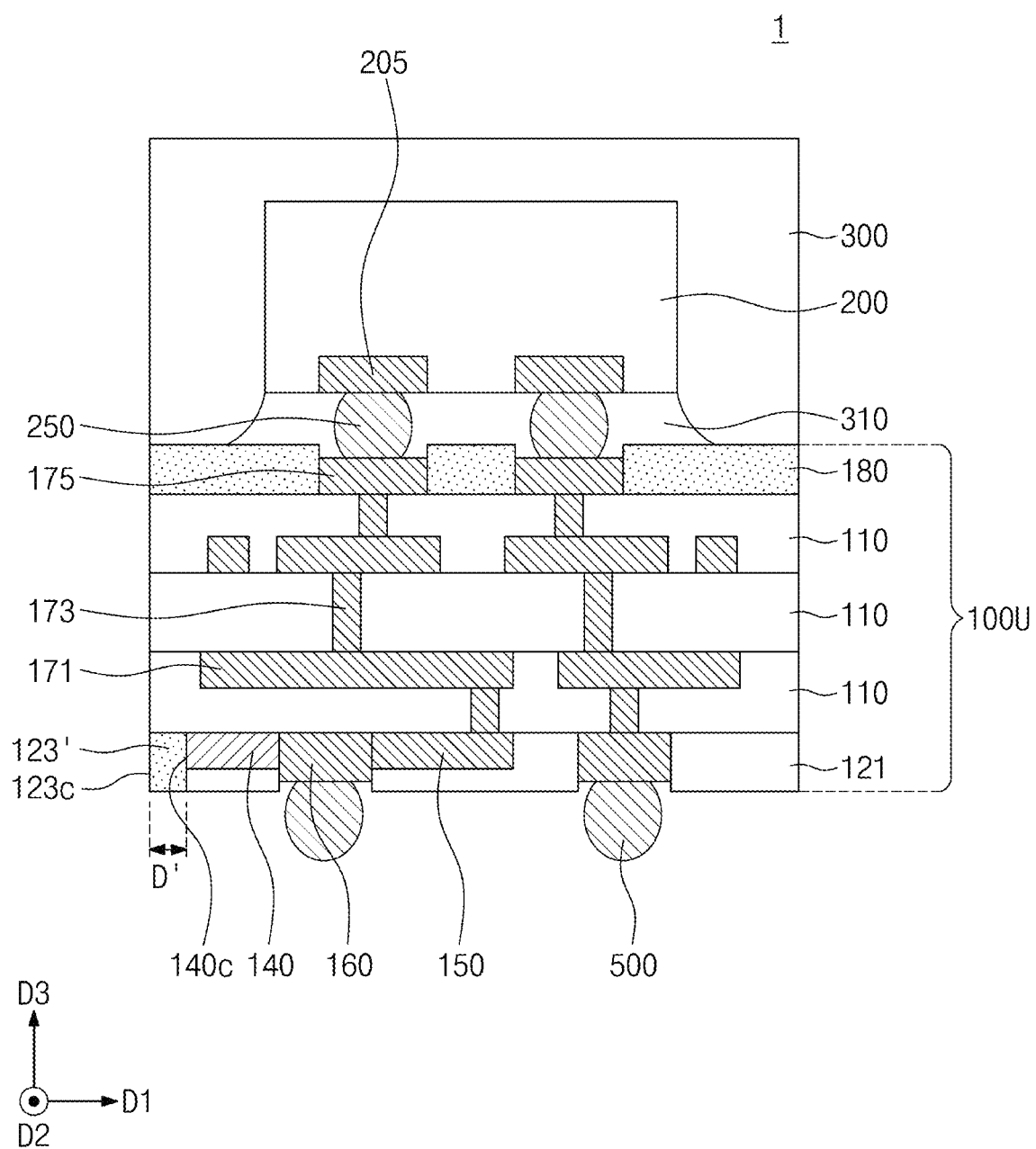
FIG. 9 illustrates a cross-sectional view showing a semiconductor package according to some example embodiments.

FIG. 9 illustrates a cross-sectional view showing a semiconductor package according to some example embodiments.

Referring to FIG. 9, a semiconductor package 1 may include the package substrate 100U, solder terminals 500, a semiconductor chip 200, and a molding layer 300. The package substrate 100U may be fabricated by sawing the strip substrate 100 as discussed in the examples of FIGS. 7A, 7B, 8A, and 8B. Alternatively, the package substrate 100U may be fabricated by sawing the strip substrate 101 of FIGS. 2A and 2B, the strip substrate 102 of FIG. 3A, or the strip substrate 103 of FIG. 3B.

The solder terminals 500 may be disposed on a bottom surface of the package substrate 100U. For example, the solder terminals 500 may be correspondingly disposed on bottom surfaces of a plurality of solder pads 160, and thus may be coupled to corresponding solder pads 160. The solder terminals 500 may be coupled through the solder pads 160 to the metal pads 175. The solder terminals 500 may be solder balls and may include metal such as a solder material. The solder material may include tin (Sn), silver (Ag), zinc (Zn), or any alloy thereof.

The semiconductor chip 200 may be mounted on a top surface of the package substrate 100U. Bump patterns 250 may be formed between and coupled to the metal pads 175 and chip pads 205 of the semiconductor chip 200. Alternatively, the semiconductor chip 200 may have chip pads 205 on its top surface, and may be electrically connected through bonding wires (not shown) to the package substrate 100U.

An under-fill layer 310 may be provided in a gap between the package substrate 100U and the semiconductor chip 200, thereby encapsulating the bump patterns 250. The under-fill layer 310 may include a dielectric polymer or a dielectric film. For example, the under-fill layer 310 may include an epoxy-based polymer.

The package substrate 100U may be provided on its top surface with the molding layer 300 that covers the semiconductor chip 200. Differently from that shown, the molding layer 300 may expose a top surface of the semiconductor chip 200. The molding layer 300 may include a dielectric polymer, such as epoxy-based polymer. Alternatively, the under-fill layer 310 may be omitted, and the molding layer 300 may further extend into a gap between the package substrate 100U and the semiconductor chip 200.

According to inventive concepts, because a conductive dummy pattern is not externally exposed, the conductive dummy pattern may be limited and/or prevented from being damaged. Therefore, it may be possible to increase reliability of a package substrate and of a semiconductor package fabricated by using the package substrate.

While some embodiments of inventive concepts have been described, inventive concepts should not be construed as limited to the embodiments set forth herein. It will be understood by one of ordinary skill in the art that variations in form and detail may be made without departing from the spirit and scope of inventive concepts. The appended claims should be construed to include other embodiments.

What is claimed is:
1. A strip substrate, comprising:
   a dielectric layer that includes a plurality of unit regions and a saw line region between the plurality of unit regions, the plurality of unit regions being spaced apart from each other in a first direction when viewed in plan;
   a plurality of conductive dummy patterns on corresponding ones of the plurality of unit regions of the dielectric layer, respectively;
   a plurality of saw line patterns on the saw line region of the dielectric layer, the plurality of saw line patterns extending in a second direction that intersects the first direction; and
   a protection pattern covering the dielectric layer,
   wherein ends of the plurality of conductive dummy patterns are spaced apart from each other in a direction parallel to the first direction, wherein ends of the plurality of saw line patterns are spaced apart from each other in a direction parallel to the second direction, and wherein the protection pattern is between the ends of the plurality of conductive dummy patterns and between the ends of the plurality of saw line patterns, wherein the ends of the plurality of conductive dummy patterns face the protection pattern and the ends of the plurality of saw line patterns face the protection pattern.

2. The strip substrate of claim 1, wherein each of the plurality of saw line patterns is not provided between the ends of the plurality of conductive dummy patterns.

3. The strip substrate of claim 1, wherein
a thickness of the plurality of conductive dummy patterns is the same as a thickness of the plurality of saw line patterns, and the plurality of conductive dummy patterns include a material that is same as a material of the plurality of saw line patterns.

4. The strip substrate of claim 1, further comprising:
a dielectric passivation layer on the dielectric layer, the dielectric passivation layer covering bottom surfaces of the plurality of saw line patterns and bottom surfaces of the plurality of conductive dummy patterns, wherein the dielectric passivation layer includes a material different from a material of the protection pattern.

5. The strip substrate of claim 1, wherein
the plurality of saw line patterns includes a first saw line pattern, a second saw line pattern, and a marker pattern on a bottom surface of the dielectric layer, the first saw line pattern has a major axis parallel to the first direction, the second saw line pattern has a major axis parallel to the second direction, the marker pattern is connected to the first saw line pattern and the second saw line pattern, and a thickness of the marker pattern is greater than a thickness of the second saw line pattern.

6. A strip substrate, comprising:
a dielectric layer that includes a plurality of unit regions and a saw line region between the plurality of unit regions, the plurality of unit regions being spaced apart from each other in a first direction when viewed in plan;

a plurality of conductive dummy patterns on corresponding ones of the plurality of unit regions of the dielectric layer, respectively;

a plurality of saw line patterns on the saw line region of the dielectric layer, the plurality of saw line patterns extending in a second direction that intersects the first direction;

a protection patterns covering the dielectric layer; and a plurality of solder pads on corresponding ones of the plurality of unit regions of the dielectric layer, respectively, wherein ends of the plurality of conductive dummy patterns are spaced apart from each other in a direction parallel to the first direction, wherein ends of the plurality of saw line patterns are spaced apart from each other in a direction parallel to the second direction, wherein the protection pattern is between the ends of the plurality of conductive dummy patterns and between the ends of the plurality of saw line patterns, and wherein the plurality of solder pads are laterally spaced apart from and electrically connected to corresponding conductive dummy patterns among the plurality of conductive dummy patterns.

7. The strip substrate of claim 6, wherein the plurality of conductive dummy patterns are correspondingly between the protection pattern and the plurality of solder pads.

8. The strip substrate of claim 6, wherein a thickness of the plurality of solder pads is greater than a thickness of the plurality of conductive dummy patterns.

9. The strip substrate of claim 8, wherein a difference between the thickness of the plurality of solder pads and the thickness of the plurality of conductive dummy patterns is in a range of about 2.3 μm to about 10.6 μm.

10. The strip substrate of claim 6, further comprising:
a plurality of wiring patterns on the plurality of unit regions of the dielectric layer and connected to the plurality of solder pads, wherein the plurality of conductive dummy patterns are correspondingly between the saw line region and the plurality of wiring patterns.

11. The strip substrate of claim 6, wherein each of the plurality of solder pads includes:
a first solder pad on a bottom surface of the dielectric layer, the first solder pad including a material that is the same as a material of the plurality of conductive dummy patterns; and a second solder pad on a bottom surface of the first solder pad, the second solder pad including a material different from the material of the plurality of conductive dummy patterns.

12. A strip substrate, comprising:
a dielectric layer that includes a first unit region, a second unit region spaced apart in a first direction from the first unit region, and a saw line region between the first unit region and the second unit region, when viewed in plan;

a first conductive dummy pattern on a bottom surface of the first unit region of the dielectric layer;

a second conductive dummy pattern on a bottom surface of the second unit region of the dielectric layer;

a first solder pad on the bottom surface of the first unit region of the dielectric layer and electrically connected to the first conductive dummy pattern;

a second solder pad on the bottom surface of the second unit region of the dielectric layer and electrically connected to the second conductive dummy pattern;

a first wiring pattern on the bottom surface of the first unit region of the dielectric layer and electrically connected to the first solder pad;

a second wiring pattern on the bottom surface of the second unit region of the dielectric layer and electrically connected to the second solder pad;

a plurality of saw line patterns on a bottom surface of the saw line region of the dielectric layer, each of the plurality of saw line patterns having a major axis parallel to a second direction that intersects the first direction; and a protection pattern on a bottom surface of the dielectric layer, wherein a first end of the first conductive dummy pattern is spaced apart in the first direction from a second end of the second conductive dummy pattern, wherein ends of the plurality of saw line patterns are spaced apart from each other in a direction parallel to the second direction, wherein each of the plurality of saw line patterns is not provided between the first end of the first conductive dummy pattern and the second end of the second conductive dummy pattern, and wherein the protection pattern covers a sidewall of the first end of the first conductive dummy pattern, a sidewall of the second end of the second conductive dummy pattern, and sidewalls of the ends of the plurality of saw line patterns.

13. The strip substrate of claim 12, wherein
the first conductive dummy pattern is between the first solder pad and the protection pattern, and
the second conductive dummy pattern is between the second solder pad and the protection pattern.

14. The strip substrate of claim 12, wherein
a first thickness of the first conductive dummy pattern is substantially the same as a thickness of the plurality of saw line patterns and a thickness of the first wiring pattern,
the first thickness is less than a thickness of the first solder pad, and
the first conductive dummy pattern and the second conductive dummy pattern include a material that is the same as a material of the plurality of saw line patterns.

* * * * *